United States Patent
Butcher et al.

(10) Patent No.: US 10,894,362 B2
(45) Date of Patent: *Jan. 19, 2021

(54) METHOD FOR SPECIFYING AND FABRICATING AN OBJECT, ASSOCIATED APPARATUS, AND APPLICATIONS

(71) Applicant: CORNELL UNIVERSITY, Ithaca, NY (US)

(72) Inventors: Jonathan T. Butcher, Ithaca, NY (US); Kevin H. Kang, Ithaca, NY (US); Kevin Yeh, Corvallis, OR (US); Philip Yue-Cheng Cheung, Tempe, AZ (US); Laura A. Hockaday, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/042,461

(22) Filed: Jul. 23, 2018

(65) Prior Publication Data

US 2019/0033812 A1    Jan. 31, 2019

Related U.S. Application Data

(63) Continuation of application No. 14/002,190, filed as application No. PCT/US2012/027726 on Mar. 5, 2012, now Pat. No. 10,048,668.

(Continued)

(51) Int. Cl.
*B29C 64/393* (2017.01)
*H04N 1/405* (2006.01)

(Continued)

(52) U.S. Cl.
CPC ........ *B29C 64/393* (2017.08); *G05B 19/0426* (2013.01); *G06F 30/00* (2020.01); *H04N 1/405* (2013.01); *B33Y 10/00* (2014.12)

(58) Field of Classification Search
None
See application file for complete search history.

(56) References Cited

U.S. PATENT DOCUMENTS 6,316,153 B1 * 11/2001 Goodman ............ A61K 9/0097
430/8
6,905,738 B2    6/2005 Ringeisen et al.
(Continued)

FOREIGN PATENT DOCUMENTS

WO    2005057436    6/2005

OTHER PUBLICATIONS

W. Sun, B. Starly, J. Nam, A. Darling, Bio-CAD modeling and its applications in computer-aided tissue engineering, Department of Mechanical Engineering and Mechanics, Computer-Aided Design 37 (2005)1097-1114, Accepted Feb. 2, 2005.

(Continued)

*Primary Examiner* — Jason Lin
(74) *Attorney, Agent, or Firm* — Bond, Schoeneck & King, PLLC; Blaine Bettinger

(57) ABSTRACT

A method for specifying and fabricating non-homogeneous, anisotropic, truly functionally graded objects. The objects may have defined spatial heterogeneity (e.g., a gradient in material concentration) with local randomized distributions. This local randomness is designed in such a way that global averaging results in the specified spatial heterogeneity. The fabrication of structures is an additive process in which a material is deposited in defined patterns.

22 Claims, 16 Drawing Sheets

Related U.S. Application Data

(60) Provisional application No. 61/448,710, filed on Mar. 3, 2011.

(51) Int. Cl.
    *G06F 30/00*    (2020.01)
    *G05B 19/042*    (2006.01)
    *B33Y 10/00*    (2015.01)

(56) References Cited

U.S. PATENT DOCUMENTS

| | | | |
|---|---|---|---|
| 7,625,198 B2 | 12/2009 | Lipson et al. | |
| 7,939,003 B2 | 5/2011 | Bonassar et al. | |
| 8,260,589 B1* | 9/2012 | Kumar | G06F 17/5009 703/2 |
| 2002/0062909 A1 | 5/2002 | Jang et al. | |
| 2006/0105011 A1 | 5/2006 | Sun et al. | |
| 2006/0155418 A1 | 7/2006 | Bradbury et al. | |
| 2006/0156978 A1 | 7/2006 | Lipson et al. | |
| 2010/0028999 A1* | 2/2010 | Nain | A61L 27/3804 435/377 |
| 2010/0055396 A1* | 3/2010 | Kim | H05K 3/1208 428/141 |
| 2010/0303354 A1 | 12/2010 | Reznik | |
| 2011/0169193 A1 | 7/2011 | Bonassar et al. | |
| 2011/0212501 A1 | 9/2011 | Yoo | |

OTHER PUBLICATIONS

S. Khalil, J. Nam and W. Sun, Multi-nozzle deposition for construction of 3D biopolymer tissue scaffolds, Laboratory for Computer-Aided Tissue Engineering, Department of Mechanical Engineering and Mechanics, Drexel University, Rapid Prototyping Journal, vol. 11, No. 1, 2005, pp. 9-17.

Saif Khalil, Wei Sun, Biopolymer deposition for freeform fabrication of hydrogel tissue constructs, Laboratory for Computer-Aided Tissue Engineering, Materials Science and Engineering C 27 (2007), pp. 469-478.

Saif Khalil, Wei Sun, Biopolymer deposition for freeform fabrication of hydrogel tissue constructs, Laboratory for Computer-Aided Tissue Engineering, Department of Mechanical Engineering and Mechanics, Drexel University, Available online Jun. 30, 2006, pp. 1-2.

International Search Report and Written Opinion for PCT/US2012/027726 dated Jun. 1, 2012; Forms PCT/ISA/210 and PCT/ISA/237; 6 pages.

Khalil et al., "Multinozzle deposition for construction of 3D biopolymer tissue scaffolds," Rapid Prototyping Journal, vol. 11, No. 1, 2005, pp. 9-17.

Pfister et al., "Bio functional Rapid Prototyping for Tissue-engineering Applications: 3D Bioplotting Versus 3D Printing," Journal of Polymer Science Part A: Polymer Chemistry 42:624-638 (2004).

Landers et al., "Desktop Manufacturing of Complex Objects, Prototypes and Biomedical Scaffolds by Means of Computer-assisted Design Combined with Computer-guided 3D Plotting of Polymers and Reactive Oligomers," Macromolecular Materials and Engineering 282:17-21 (2000).

Chang et al., "Injection Molding of Chondrocyte/Alginate Constructs in the Shape of Facial Implants," J. Biomed. Mat. Res. 55:503-511 (2001).

Hung et al., "Anatomically Shaped Osteochondral Constructs for Articular Cartilage Repair," J. Biomech. 36:1853-1864 (2003).

Klein et al., "Tissue Engineering of Stratified Articular Cartilage from Chondrocyte Subpopulations," Osteoarthritis Cartilage 11:595-602 (2003).

Kim et al., "Experimental Model for Cartilage Tissue Engineering to Regenerate the Zonal Organization of Articular Cartilage," Osteoarthritis Cartilage 11:653-664 (2003).

Malone et al., "Freeform Fabrication of 3D Zinc-Air Batteries and Functional Electro-Mechanical Assemblies," Rapid Prototyping Journal 10:58-69 (2004).

\* cited by examiner

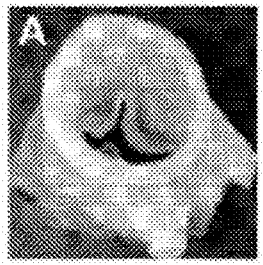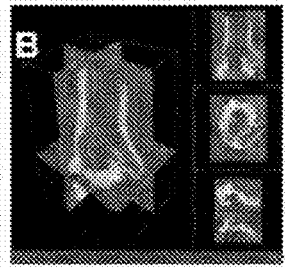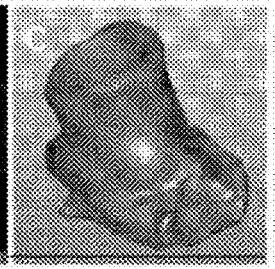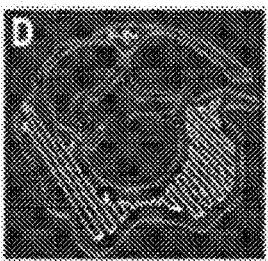
FIG. 1A    FIG. 1B    FIG. 1C    FIG. 1D
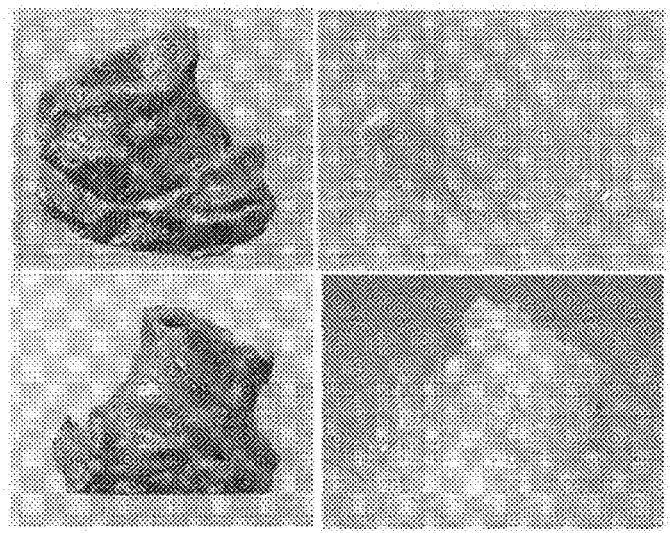
FIG. 2

FIG. 3A
FIG. 3B
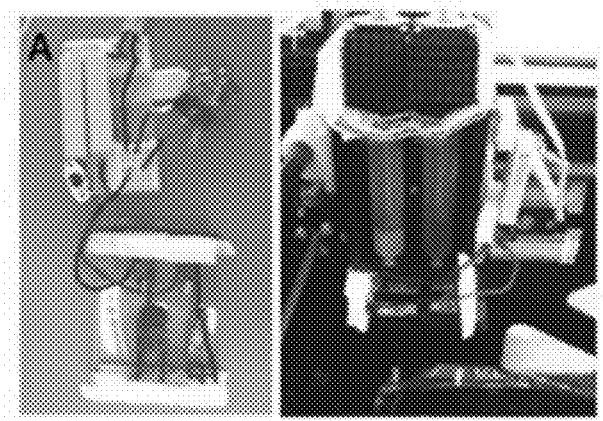
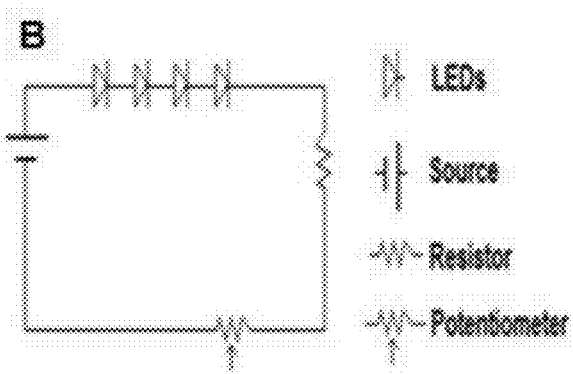
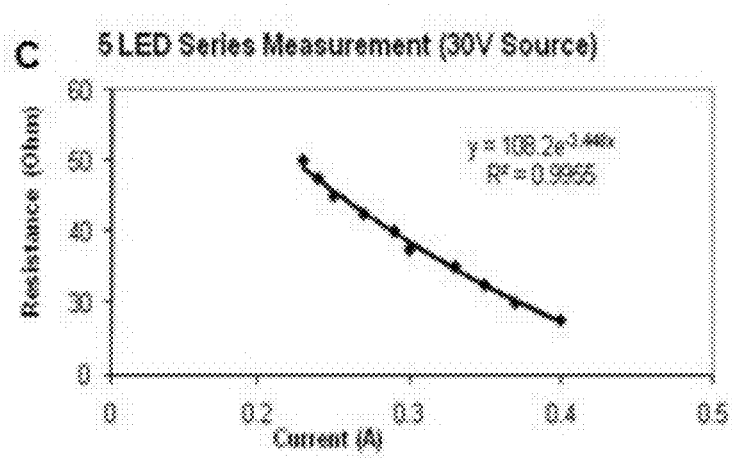
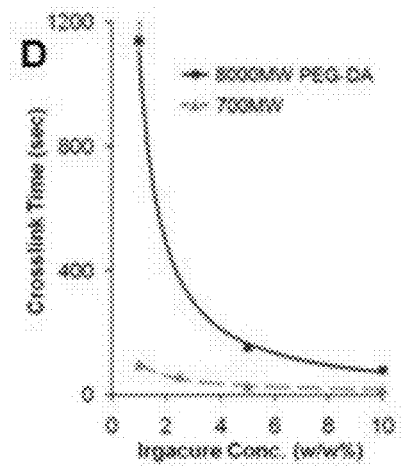
FIG. 3C
FIG. 3D

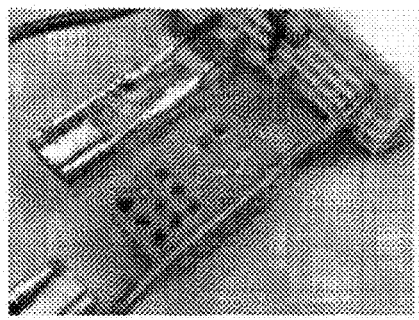 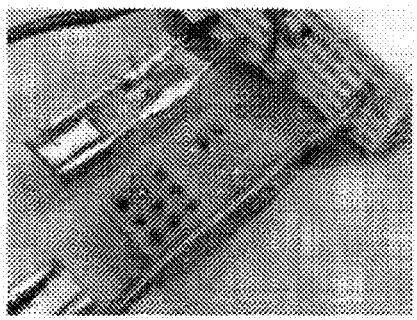 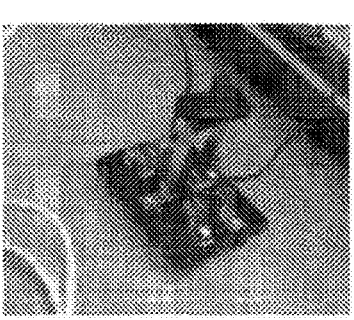
FIG. 4A  FIG. 4B  FIG. 4C
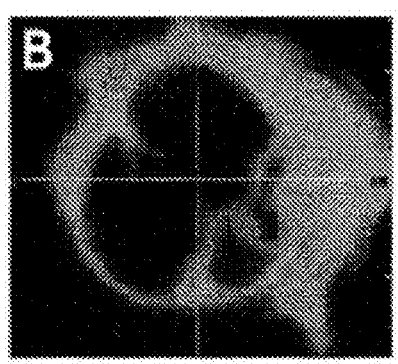 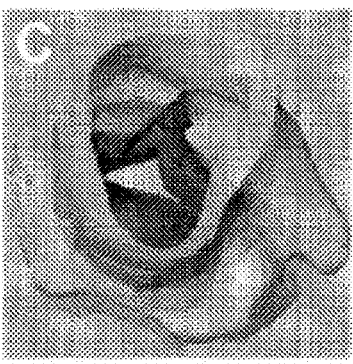 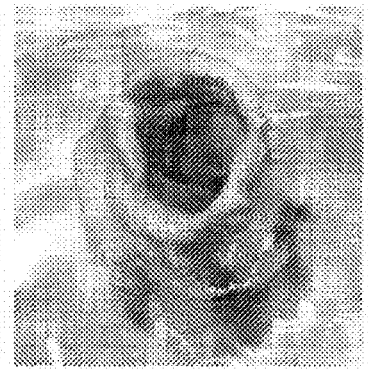
FIG. 5A  FIG. 5B  FIG. 5C

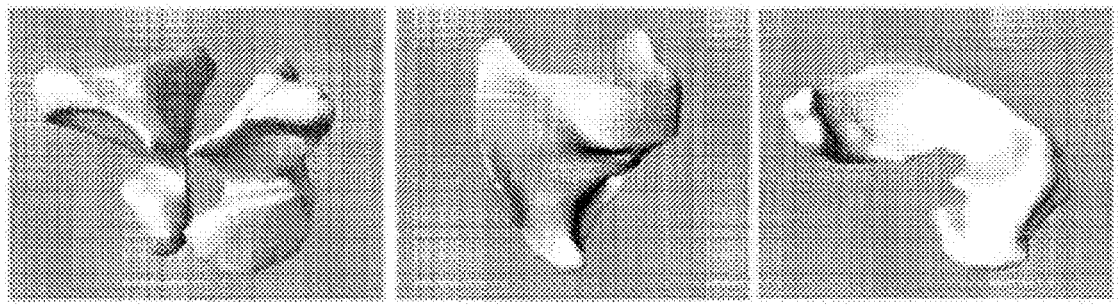
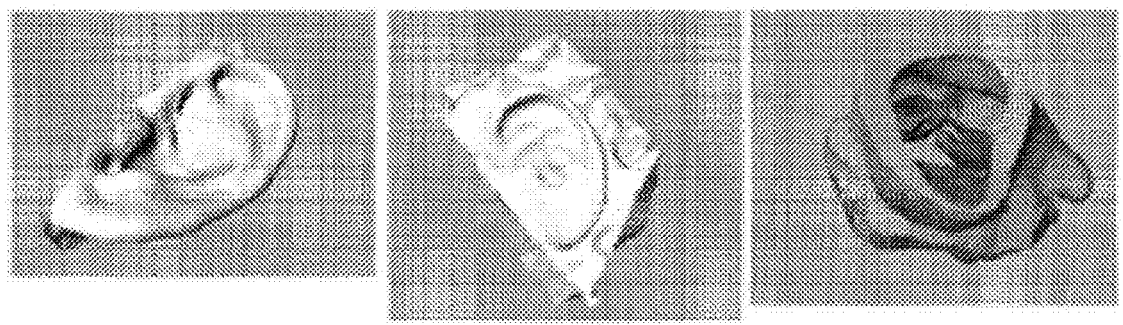
FIG. 6
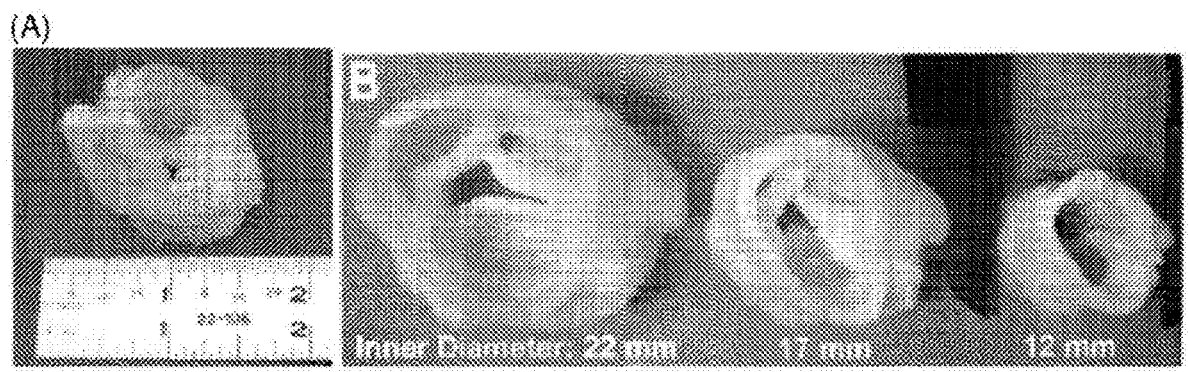
FIG. 7A  FIG. 7B

FIG. 16A
FIG. 16B
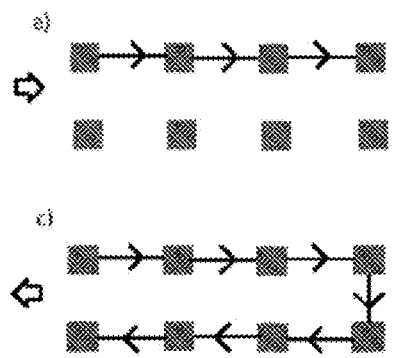
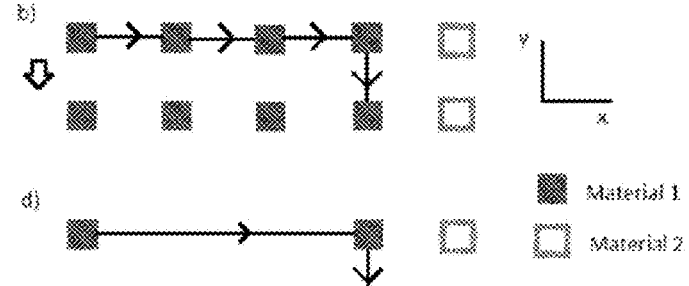
FIG. 16C
FIG. 16D
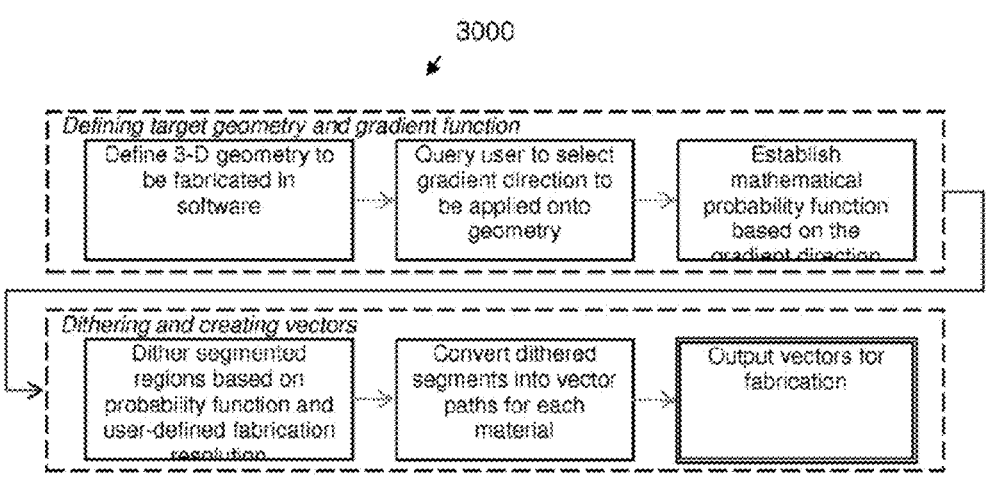
FIG. 17

US 10,894,362 B2

METHOD FOR SPECIFYING AND FABRICATING AN OBJECT, ASSOCIATED APPARATUS, AND APPLICATIONS

RELATED APPLICATION DATA

The present application is a Continuation of U.S. Non-Provisional application Ser. No. 14/002,190, filed Aug. 29, 2013, which was a U.S. National Stage Entry of PCT Application No. PCT/US12/27726, filed Mar. 5, 2012, which derives priority from U.S. Provisional application Ser. No. 61/448,710, entitled "Apparatus and Method for Creating Arbitrary Defined Functionally Graded Materials Via Solid-Free Form Fabrication" filed on Mar. 3, 2011, the entirety of each of which is hereby incorporated by reference.

BACKGROUND

Embodiments of the invention are generally directed to methods for specifying (and optionally fabricating) an object to be fabricated; more particularly, to a method for specifying (and optionally fabricating) an object to be fabricated by 3-D printing of arbitrarily defined functionally graded materials via solid freeform fabrication; and most particularly, to a method for specifying (and optionally fabricating) living tissue and other functionally graded, heterogeneous objects characterized by material heterogeneity (or blending) on a local scale.

Solid freeform fabrication ("SFF") is the name given to a class of manufacturing methods that allow the fabrication of three-dimensional structures directly from computer-aided design ("CAD") data. SFF processes are generally additive, in that material is selectively deposited to construct the object to be fabricated rather than removed from a block or billet. Most SFF processes are also layered, meaning that a geometrical description of the object to be fabricated is cut by a set of parallel surfaces (planar or curved), and the intersections of the object and each surface, referred to as slices or layers, are fabricated sequentially. Together, these two properties mean that SFF processes are subject to very different constraints than traditional material removal-based manufacturing. Nearly arbitrary object geometries are achievable, no tooling is required, mating parts and fully assembled mechanisms can be fabricated in a single step, and multiple materials can be combined, allowing what has been referred to in the literature as 'functionally graded' material properties. It is to be noted, however, that the term 'functionally graded' as used in the art refers to the macroscopic combination of materials in a layer, akin to pieces of a jig-saw puzzle, but not to a localized, microscopic-scale heterogeneity or blending of materials. Notwithstanding, new features, parts, and even assembled components can be "grown" directly on already completed objects, suggesting the possibility of using SFF for the repair and physical adaptation of existing objects. On the other hand, a deposition process must be developed and tuned for each material, geometry is limited by the ability of the deposited material to support itself, by the (often poor) resolution and accuracy of the process, and multiple material and process interactions must be understood.

SFF has traditionally focused on printing passive mechanical parts or products in a single material, and research has emphasized developing new deposition processes, improving quality, resolution, and surface finish of fabricated objects, and broadening the range of single materials that can be employed by a given SFF process, including biocompatible polymers and other biomaterials and living cells. These improvements have allowed freeform fabrication to become a viable means of manufacturing finished functional parts, rather than only prototypes.

More recently, the greater utility of freeform fabricated objects having multiple materials has been recognized, prompting reexamination and novel research into processes which can fabricate objects using multiple materials and, which can thereby produce complex articles with a variety of functionality, including functionally graded materials. All of these systems still depend upon a small fixed set of deposition process technologies, and are therefore limited to the materials that can be adapted to those processes, by the effects of those particular processes on the materials, and by the fabrication rates and resolutions of those processes. For example, the system of U.S. Pat. No. 6,905,738 to Ringeisen et al. requires that for every material to be deposited, a two material system be developed comprising the material to be transferred, and a compatible matrix material that is vaporized by the laser in order to propel the transfer material to the substrate. In addition, this system has only demonstrated fabrication of thin films of materials; its ability to deposit many layers of materials is not well established. The system and method of Sun et al., "Multinozzle Biopolymer Deposition for Tissue Engineering Application," 6.sup.th International Conference on Tissue Engineering, Orlando, Fla. (Oct. 10-13, 2003) and International Patent Application No. PCT/US2004/015316 to Sun et al., is limited to a fixed set of four deposition processes and requires that alginate materials be deposited into a bath of liquid cross linking agent, a limitation it shares with the work of Pfister et al., "Bio functional Rapid Prototyping for Tissue-engineering Applications: 3D Bioplotting Versus 3D Printing," Journal of Polymer Science Part A: Polymer Chemistry 42:624-638 (2004) and Landers et al., "Desktop Manufacturing of Complex Objects, Prototypes and Biomedical Scaffolds by Means of Computer-assisted Design Combined with Computer-guided 3D Plotting of Polymers and Reactive Oligomers," Macromolecular Materials and Engineering 282:17-21 (2000). In addition, none of these systems explicitly measures the properties of, and monitors and controls the conditions experienced by the fabrication materials, the fabrication substrate, and the article under construction before, during, and/or after fabrication as an intrinsic part of the fabrication process and manufacturing plan. The fabrication process is thus limited to the spatial control of material placement on relatively simple, passive substrates. Temporal control of the evolution of material properties is therefore not possible, and complex substrates whose state must be controlled and monitored continuously are not readily accommodated. Fabricating into or onto substrates, such as living organisms or devices which must remain in operation continuously, is problematic.

A major challenge in orthopedic tissue engineering is the generation of seeded implants with structures that mimic native tissue, both in terms of anatomic geometries and intra-tissue cell distributions. Previous studies have demonstrated that techniques such as injection molding (Chang et al., "Injection Molding of Chondrocyte/Alginate Constructs in the Shape of Facial Implants," J. Biomed. Mat. Res. 55:503-511 (2001)) and casting (Hung et al., "Anatomically Shaped Osteochondral Constructs for Articular Cartilage Repair," J. Biomech. 36:1853-1864 (2003)) of hydrogels can generate cartilage tissue in complex geometries. Other studies have investigated methods to reproduce regional variations in articular cartilage constructs by depositing multiple layers of chondrocytes (Klein et al., "Tissue Engineering of Stratified Articular Cartilage from Chondrocyte Subpopulations," Osteoarthritis Cartilage 11:595-602 (2003)) or chondrocyte-seeded gels (Kim et al., "Experimental Model for Cartilage Tissue Engineering to Regenerate the Zonal Organization of Articular Cartilage," Osteoarthritis Cartilage 11:653-664 (2003)). However, there remains no viable strategy for rapidly producing implants with correct anatomic geometries and cell distributions. Recently, advances in SFF techniques have enabled the deposition of multilayered structures composed of multiple chemically active materials (Malone et al., "Freeform Fabrication of 3D Zinc-Air Batteries and Functional Electro-Mechanical Assemblies," Rapid Prototyping Journal 10:58-69 (2004)).

Tissue failure is a serious condition that can lead to deterioration of lifestyle and potentially to death. Medical advances in the past several decades have enabled the replacement of damaged tissues with mechanical or biochemical implants designed to mimic the function of the defective tissues. While these implants, such as, e.g., heart valves and hip-bone replacements, have demonstrated promising performance, such implants are susceptible to wear and degradation over time. More critically, these implants are incapable of repair or regeneration. This can become fatally problematic for infants and younger patients since their bodies can outgrow the implants and subsequently cause implant failure. Multiple surgeries would be necessary for implant resizing, but such operations can be traumatic for patients. While some conditions can be treated with implants, other failures in larger tissues, such as the heart and liver, are more serious since implants that can replace these tissues do not exist. As a result, patients rely on donors for treatment, but the demand of such organs far exceeds the available supply.

Tissue engineering has the potential to alleviate these limitations by providing living tissue replacements capable of growth and integration. A major technical challenge facing the field as a whole, however, is to both effectively fabricate tissue geometry and to specify (and/or control) locally heterogeneous tissue biomechanics. Creating complex, non-symmetric geometries that are applicable to tissue engineering can be approached using solid-freeform fabrication (SFF), or three-dimensional (3D) printing.

Geometrically complex hard tissues including knee meniscus, bone, and cartilage can be fabricated. 3-D printing of highly extensible soft tissues, meanwhile, can be more challenging because gravity forces cause deposited viscous fluids to spread unless they are crosslinked, which limits the building of tall or non-self supportive geometries such as heart valves.

Pertinent object fabrication systems and methods are disclosed in U.S. Pat. Nos. 7,625,198, 7,939,003, and Pub. No. US 2011/0169193, the subject matters of which are hereby incorporated by reference in their entireties. To date, however, materials are deposited as separate, homogeneous materials, not as an interspersed or blended heterogeneous composite as would be required, for example, for truly functionally graded tissue engineering and fabrication. (i.e., composites with gradual variation in composition and structure, creating differences in material properties over the volume as, for example, by specifying distribution gradients as functions of spatial position).

The inventors have thus recognized the benefits and advantages provided by solutions to the aforementioned problems and known challenges in this field. These solutions include, among other things, the ability to simultaneously solid freeform fabricate and crosslink anatomically precise constructs in the form of stable, soft tissue structures; the ability to specify and fabricate tissues exhibiting localized heterogeneous (blended) biomechanics; the ability to access the print accuracy of the constructs.

SUMMARY

An embodiment of the invention is a machine-implemented method for specifying a target object to be fabricated. The method includes the steps of i) defining the target object to be fabricated; ii) determining a locally-heterogeneous, anisotropic distribution of phenotypic characteristics of the target object to be fabricated; iii) ascribing the distribution of phenotypic characteristics to a plurality of materials from which the target object will be fabricated; iv) stitching (i.e., joining or otherwise combining) together each distribution corresponding to respective ones of the materials into respective sets of vector paths corresponding to respective ones of the materials, wherein each set of vector paths is one or more line elements of a given length and orientation; and v) creating a vector print file for the target object readable by a compatible fabrication machine such as, e.g., a software-controlled 3-D printer. Note that the created vector paths need not be limited to straight lines or Cartesian coordinates (e.g., curves can be approximated as many short lines to make the traversing motor of the fabrication apparatus move in the appropriate directions). In various exemplary, non-limiting aspects, the method further includes the following steps, processes, and/or characteristics:

wherein the step of defining the target object to be fabricated comprises either sourcing the target object from a prescribed image or from a mathematical model;

wherein the step of sourcing the target object from a prescribed image further comprises reconstructing the image of the target object into a 3-D machine-readable format;

wherein the step of sourcing the target object from a mathematical model further comprises defining the 3-D geometry of a selected target object;—determining a gradient distribution of material compositions of the target object to be applied to the geometry;

establishing a probability distribution function based on the gradient distribution to determine a plurality of path segments and assigning a plurality of one or more of the path segments to a corresponding plurality of materials from which the target object will be fabricated;

dithering the pluralities of path segments based on the probability distribution function;

converting the dithered path segments into respective sets of vector paths corresponding to respective ones of the materials, wherein each set of vector paths is one or more line elements of a given length and orientation; and creating a vector print file for the target object readable by a compatible fabrication apparatus;

wherein the gradient distribution is linear;

wherein the gradient distribution is non-linear;

wherein the gradient distribution is radial;

wherein the gradient distributions are representative of planar and volumetric imaging data (e.g., computed tomography (CT));

further comprising outputting the vector print file for the target object to the compatible fabrication apparatus and fabricating the target object.

further comprising fabricating the target object in a series of n fabrication layers, and curing a selected region of each $n_{th}$ fabrication layer simultaneously with the layer fabrication or prior to the fabrication of the $n^{th}+1$ layer.

the method further comprising obtaining a plurality of image layers; determining a desired image resolution; selecting one or more of the plurality of image layers as an $n^{th}$ fabrication layer image, where n is equal to or greater than one; and optionally, resizing the $n^{th}$ fabrication layer image for specifying at least one of a size and a volume characteristic of the target object;

wherein the step of determining a locally-heterogeneous, anisotropic distribution of phenotypic characteristics of the target object to be fabricated further comprises assigning values between zero to one to a each of a plurality of pixels or voxels, or to each of a plurality of sets of adjoining pixels or voxels, of the $n_{th}$ fabrication layer image;

wherein the step of ascribing the distribution of phenotypic characteristics to a plurality of materials from which the target object will be fabricated further comprises associating a plurality of the assigned values to respective ones of the materials;

wherein the step of associating a plurality of the assigned values to respective ones of the materials further comprises thresholding the assigned values;

wherein the step of associating a plurality of the assigned values to respective ones of the materials further comprises determining Hounsfield unit values for the pixels or voxels;

further comprising removing background that is not a part of the target object from the nth fabrication layer image;

further comprising creating temporary support structures to aid in the stability of subsequently fabricated layers of the object;

wherein the step of stitching together each distribution further comprises dithering each of the plurality of the assigned values into a plurality of segments corresponding to respective ones of the materials;

further comprising utilizing a Floyd-Steinberg dithering algorithm or other known dithering algorithm;

further comprising converting each of the plurality of segments into the vector paths for the respective ones of the materials;

wherein the step of creating a vector path further comprises a) selecting a starting index; b) comparing the starting index to an adjacent index in a specified direction; c) determining whether the starting and adjacent indices are assigned to the same one of the materials, and d) if the starting and adjacent indices are assigned to the same one of the materials, then (e) creating a vector path between the indices, or f) if the starting and adjacent indices are not assigned to the same one of the materials, then g) changing the adjacent index into a new starting index and performing steps (b-e); and h) performing steps (a-g) until a sufficient number of vector paths have been generated to specify the target object;

further comprising iteratively performing steps (iii-v) for a plurality of the $n_{th}$ fabrication layers, where n is equal to or greater than one;

further comprising iteratively performing steps (iii-v) for a plurality of n fabrication layers, where n is equal to or greater than one;

wherein the phenotypic characteristics of the target object to be fabricated are surface and/or internal phenotypic characteristics;

further comprising outputting the vector print file for the target object to the compatible fabrication apparatus and fabricating the target object;

further comprising outputting the vector print file for the target object to the compatible fabrication apparatus and fabricating the target object;

further comprising fabricating the target object in a series of n fabrication layers, and photo-curing a selected region of each $n^{th}$ fabrication layer simultaneously with the layer fabrication or prior to the fabrication of the $n^{th}+1$ layer;

further comprising fabricating the target object in a series of n fabrication layers, and photo-curing a selected region of each $n^{th}$ fabrication layer simultaneously with the layer fabrication or prior to the fabrication of the $n^{th}+1$ layer.

Embodiments of the invention enable solid freeform fabrication (e.g., 3-D printing) of objects using arbitrarily defined functionally graded materials. Functionally graded materials are composites with gradual variation in composition and structure, creating differences in material properties over the volume of the object. A defined, functionally graded material can be specified, and fabricated, by specifying distribution gradients as, e.g., functions of spatial position, in an automated, computer controlled process (algorithm). The algorithm can generate deposition paths that are communicated to a fabrication robot for production of the object from the functionally graded materials.

In an exemplary embodiment, the invention enables fabrication of a functionally graded object from cell-seeded photocrosslinkable hydrogels with differing mechanical properties and differing cell populations for tissue engineering. The gradients in composition and structure can be defined to reflect native tissue, serving as a basis for accurate scaffold production for, e.g., research or therapeutics. Gels are selectively deposited as viscous liquids and then crosslinked by exposure to UV to produce a three-dimensional solid structure.

Curing or crosslinking of the hydrogels via UV exposure can be accomplished using a software-controlled adjustable-beam UV source. An adjustable or interchangeable lens system permits focusing of the beam to change the illumination intensity and spot size for small point curing or broad illumination. A bipolar junction transistor can serve as a switch that permits the passing of current to the UV source when an ON command is issued by software, and fails safe into an OFF position. For additional controllability, a potentiometer or amplifying element can be used to adjust the circuit, thereby tuning the intensity of the UV source.

Non-photocrosslinkable support structures may also be implemented. Support structures may advantageously limits a current layer from settling and spreading out before it can be cured; otherwise, the layer may be shorter than expected and cause the fabrication (e.g., extrusion) of the next layer to miss the object's upper surface. Support structures may also help to make the object's upper surface flat for subsequent surfaces to print on, thereby limiting compound errors.

This technology is advantageous for a number of material science applications requiring precise control over three-dimensional shape and integrated multi-material composition. Previous technology focused on the deposition of functionally separate but adjoining entities, which does not represent heterogeneity on a local scale. The instant technology also enables the acquisition of local material geometry and multiaxial material gradients using data extractable from a variety of imaging platforms. This technology is fundamental to a number of important freeform fabrication applications, including but not limited to: automatic fabrication of materials that have locally spatially varying material characteristics that can be prescribed directly, randomized, or created according to a distribution function comprising two or more components along two or more directions; improved sealing method to meld multiple distinct materials in 3D space, whether as one or multiple connected objects; for biological applications in which this technology enables the creation of materials that recapitulate intrinsic local material heterogeneity, and when combined with cells enables fabrication of living heterogeneous materials.

BRIEF DESCRIPTION OF THE DRAWINGS

FIG. 1A shows an example of fabricating a heart valve replacement according to an exemplary embodiment of the invention;

FIG. 1B shows an example of fabricating a heart valve replacement according to an exemplary embodiment of the invention;

FIG. 1C shows an example of fabricating a heart valve replacement according to an exemplary embodiment of the invention;

FIG. 1D example of fabricating a heart valve replacement according to an exemplary embodiment of the invention;

FIG. 2 shows the results of printed heart valve samples printed with single material (8000 MW PEG-DA) using the data obtained from FIG. 1, according to an illustrative aspect of the invention;

FIG. 3A shows an illustrative aspect that allows the crosslinking time of hydrogels to be controlled in several ways, according to an illustrative aspect of the invention;

FIG. 3B shows an illustrative aspect that allows the crosslinking time of hydrogels to be controlled in several ways, according to an illustrative aspect of the invention;

FIG. 3C shows an illustrative aspect that allows the crosslinking time of hydrogels to be controlled in several ways, according to an illustrative aspect of the invention;

FIG. 3D shows an illustrative aspect that allows the crosslinking time of hydrogels to be controlled in several ways, according to an illustrative aspect of the invention;

FIG. 4A shows an LED crosslinking module located closer to the hydrogel surface, according to illustrative aspects of the invention;

FIG. 4B shows an LED crosslinking module located closer to the hydrogel surface, according to illustrative aspects of the invention;

FIG. 4C shows a switch that can be used to turn the crosslinking module on and off, according to illustrative aspects of the invention;

FIG. 5A illustrates a fabricated heart valve model and process, according to an illustrative aspect of the invention;

FIG. 5B illustrates a fabricated heart valve model and process, according to an illustrative aspect of the invention;

FIG. 5C illustrates a fabricated heart valve model and process, according to an illustrative aspect of the invention;

FIG. 6 illustrates other exemplary geometries printed with photocrosslinking hydrogels using the embodied crosslinking module, according to an illustrative aspect of the invention;

FIG. 7A shows the smallest commercially available mechanical heart valve, according to an illustrative aspect of the invention;

FIG. 7B shows printed valves in different sizes, demonstrating that valves can be fabricated to sizes specific to a patient, according to an illustrative aspect of the invention;

FIGS. 9(A-D) illustrate the fabrication method and apparatus for printing living tissue, according to an illustrative aspect of the invention;

FIG. 16A is a schematic block diagram illustrating an optimized, prioritization scenario of converting dithered segments into vectors by directionality, according to an aspect of the invention;

FIG. 16B is a schematic block diagram illustrating an optimized, prioritization scenario of converting dithered segments into vectors by directionality, according to an aspect of the invention;

FIG. 16C is a schematic block diagram illustrating an optimized, prioritization scenario of converting dithered segments into vectors by directionality, according to an aspect of the invention;

FIG. 16D is a schematic block diagram illustrating an optimized, prioritization scenario of converting dithered segments into vectors by directionality, according to an aspect of the invention;

FIG. 17 is a flowchart describing the programmable machine-enabled process steps for specifying (and ultimately fabricating) geometries exhibiting anisotropic heterogeneity based on mathematical models that are different than the process steps shown in FIG. 12, according to an embodiment of the invention;

DETAILED DESCRIPTION OF EXEMPLARY, NON-LIMITING EMBODIMENTS

Figure 8B:
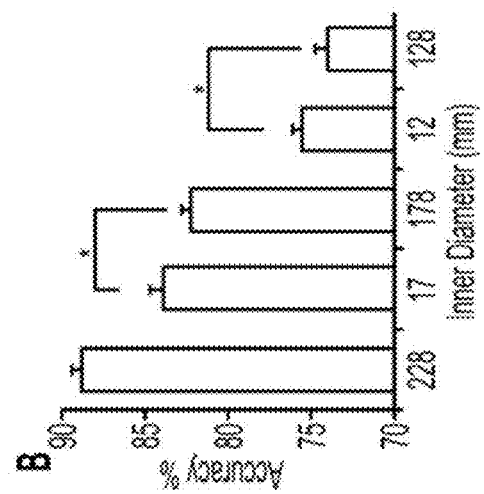
FIG. 8B illustrates an assessment of the embodied printing method, according to an illustrative aspect of the invention.

According to an aspect, the fabrication method described herein is an additive process that rapidly recreates 3-D computer-aided design (CAD) models. This is accomplished by slicing the models into layers and building the layers upward using deposition tools that can extrude different materials. Materials that can be used to build tissue engineered constructs include hydrogels, which may be photocured (crosslinked) or otherwise structurally solidified. Hydrogels are generally aqueous and are attractive fabrication materials since they can be freely extruded into desired shapes. In addition, hydrogels form long-term, robust structures upon photocuring by radiation exposure (e.g., UV).

An exemplary printing method uses PEG-DA (poly(ethylene glycol)-diacrylate hydrogels, which polymerize when exposed to UV radiation at 365 nm. However, the application of this process can be extended to other photocrosslinking hydrogels such as, but not limited to, PEG-DA-PEA (poly-ester amide), GMA-chitosan, and alginate.

FIGS. 1(A-D) show an example of fabricating a heart valve replacement using the embodied invention. Starting at FIG. 1A, a native porcine aortic valve was scanned using micro-computer tomography (micro-CT). The tissue exhibits the three leaflets that direct the blood to flow unidirectional. The surrounding wall, or the root, joins and stabilizes the leaflets together. The scanned valve, which can be visualized in the whitish (lighter) regions (FIG. 1B), is then reconstructed into a 3-D stereolithography file (STL; FIG. 1C), which is a CAD-based format. Once the STL models are imported into the printing system, the software slices the model into layers. The deposition then prints the contour (in red) and the inner regions of each layer (green) (FIG. 1D). FIG. 2 shows the results of printed heart valve samples printed with a single material (8000 MW PEG-DA) using the data obtained from FIG. 1.

In an aspect, printing and crosslinking of hydrogels is an alternating procedure: after printing a layer, the printing is paused and UV light is exposed onto the deposited layer to crosslink the hydrogels. This process is repeated until the construct is built. In another aspect, structures such as those made from hydrogels can also be accurately and efficiently printed and crosslinked simultaneously. The UV source used to crosslink must provide sufficient power to initiate the crosslinking reaction. A crosslinking module containing, e.g., UV-LEDs can be mounted parallel to the surface, and directly below the deposition tools. Placing the module this way can provide enhanced UV exposure to the hydrogels, resulting in more efficient hydrogel crosslinking during printing. It should be appreciated that photocuring and, particularly photocuring with UV, is exemplary; however, any applicable chemical or other energy source useful for solidifying or structurally stabilizing a material(s) during object fabrication is envisioned herein. Appropriate curing can be performed on the $n_{th}$, $n^{th}+1$, and/or $n^{th}-1$ layers.

To build hydrogel structures, controlling the timing of the hydrogel crosslinking is important for successful fabrication. If the hydrogels crosslink too slowly, the construct will be unstable because each printed layer does not crosslink enough to provide structural support for subsequent layers. Hydrogels crosslinking too fast is also problematic since each layer can crosslink completely before the following layer is printed. This prevents different layers from fusing with each other, which makes the constructs susceptible to delamination.

FIG. 3A shows an illustrative design aspect that allows the crosslinking time of hydrogels to be controlled in several ways. First, the power output of the crosslinking module can be adjusted by changing the electrical resistance through a potentiometer (FIG. 3B). Reducing the resistance increases current through the LEDs (and subsequently the power output) (FIG. 3C). This can accommodate the necessary current to crosslink different materials, which could have different crosslinking behavior (i.e. crosslinking time, color). For example, 8000 MW PEG-DA crosslinks slower than 700 MW PEG-DA when exposed to the same amount of UV radiation (FIG. 3D). One would thus increase the power when printing the 8000 MW PEG-DA hydrogel so that the crosslinking time becomes comparable to that of 700 MW PEG-DA. The LEDs on the module can also be placed at different locations in the circuit as illustrated in FIG. 4: A) closer to surface; B) further from surface). Locating hydrogels closer to the surface leads to faster crosslinking, and locating them further away would lead to slower crosslinking. The crosslinking module may also be turned on and off using a switch (FIG. 4C). This control allows the LEDs to be turned off momentarily to prevent overcrosslinking of gels. The switch can be operated manually or can be enabled by the printer.

Using the above described or other suitable crosslinking module, geometries can be printed more accurately. Starting with the valve scan shown in FIG. 1A, the valve leaflets were separated from the surrounding root via thresholding. The leaflets have a less dense tissue density than the root. As a result, the leaflets appear whiter than the surrounding root. Based on the grayscale pixel values, the leaflet regions can be thresholded and isolated from the root (FIG. 5A). The finished STL model after cleanup is shown in FIG. 5B (leaflet: red; root: blue). The models shown in FIG. 5 were printed with two different materials and photocured using the UV crosslinking system described hereinabove. The similarity between the STL model (FIG. 5B) and the printed scaffold (FIG. 5C) is evident. The printed valve now also features the coronary ostium, a tube that protrudes from the root to channel blood directly to the heart itself.

Other illustrative geometries can also be printed with photocrosslinking hydrogels using the above described crosslinking module, as shown in FIG. 6. Note however, the embodied object specification and fabrication method embodiments disclosed herein are not limited to a particular type of medium, method of material deposition, method of solidification (e.g., curing), or object specified or fabricated. Rather, the invention pertains to specifying and generating vector-based deposition paths for a selected material(s) to specify and, optionally fabricate virtually any object of interest. Although extruding the material(s) is disclosed as an advantageous aspect of the invention, other techniques may include sintering material(s) in these paths, laying molten metal in these paths.

FIG. 7B shows printed valves in different sizes, demonstrating that valves can be fabricated to sizes specific to a patient. The largest valve spanned 22 mm (adult size) in inner diameter while the smaller one spanned 12 mm (children size). In comparison, the smallest commercially available mechanical valve spans 17 mm (FIG. 7A), a size too large for children.

Figure 8A:
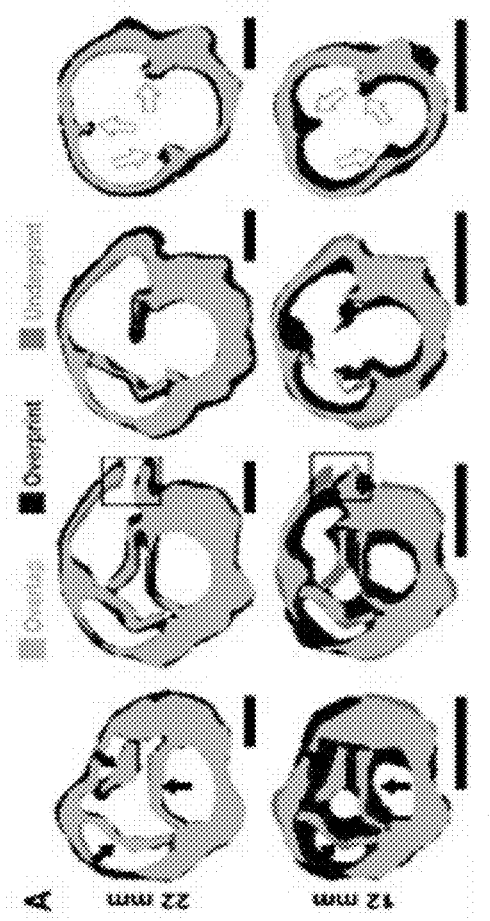
FIG. 8A illustrates an assessment of the embodied printing method, according to an illustrative aspect of the invention.
Figure 9B:
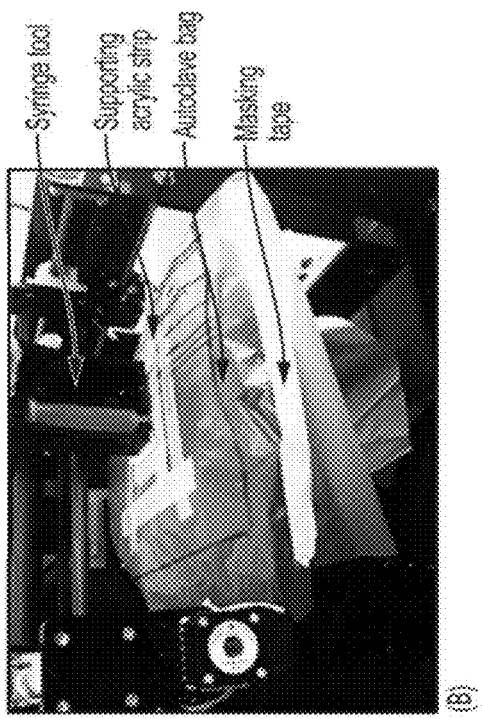
FIG. 9B illustrates the fabrication method and apparatus for printing living tissue, according to an illustrative aspect of the invention.
Figure 9D:
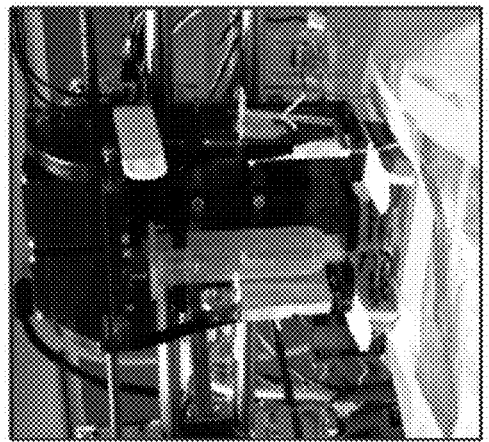
FIG. 9D illustrates the fabrication method and apparatus for printing living tissue, according to an illustrative aspect of the invention.
Figure 9A:
FIG. 9A illustrates the fabrication method and apparatus for printing living tissue, according to an illustrative aspect of the invention.
Figure 9C:
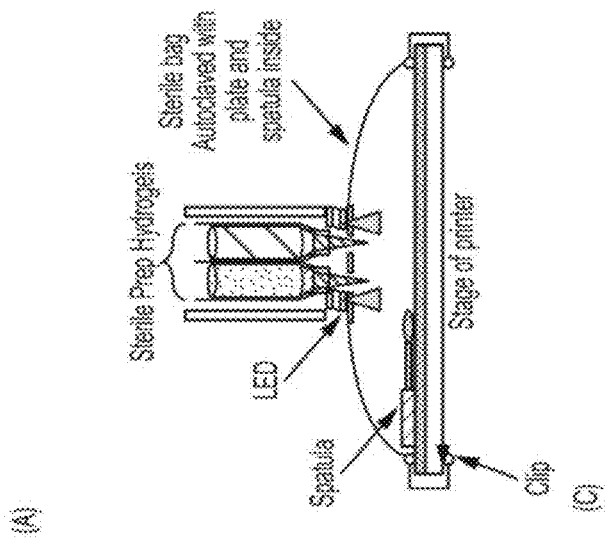
FIG. 9C illustrates the fabrication method and apparatus for printing living tissue, according to an illustrative aspect of the invention.

In addition to building the constructs in the right scale, implants also need to be printed accurately to fit into the patient. To access the accuracy of the printing method, we analyzed the shape fidelity of the printed constructs. Printed constructs first underwent CT scan, and the resulting images were matched to the target print images (FIG. 1D). By over lapping the Scanned and target images, we can identify the regions printed accurately (overlap; FIG. 8A). The comparison map also indicates regions where too much material (overprint) and too little material (underprint) were printed. The largest valve was printed most accurately (89%) while the smallest was printed least accurately (73%); (FIG. 8B). Analysis also showed that soaking the valves in buffer solution after print causes the scaffold to Swell, causing the geometry to change through expansion. As a result, Swelling decreased the print accuracy on fully hydrated Samples, but only less by 1-2% to corresponding non-Saturated Samples.

To demonstrate that the embodied fabrication technique can yield living tissues, we generated hydrogel valve constructs with cells attached and cultured in the scaffold (FIGS. 9(A-D)). Initially a sterile tent was built using an autoclave bag, although the tent may be composed of any sterile material that could encompass the hydrogel. After punching holes onto the tent, the tent was sealed and autoclaved. The tent was then unsealed in a sterile culture hood, and the deposition tools printed hydrogels inside the tent through the holes. The crosslinking module attached to the deposition tool transmitted UV light through the tent to crosslink hydrogels.

After valves were printed and subsequently rinsed in buffer, they were placed in vials containing media and valve interstitial cells (VICs). Vials were spun for 24 hrs so that cells were attached onto the valve. Cell-seeded valves were then cultured in culture flasks filled with media for days 1, 7, and 21 at 37° C. and 5% $CO_2$. After culture, the root and leaflet sections were imaged to observe cell viability. In all cultured samples, dead cells were not detected, suggesting 100% viability for all days.

Although valve geometries replicating the native structure can be generated as demonstrated above, the greater challenge in tissue engineering is to replicate the heterogeneous biomechanics and the cell phenotype inherent in the native tissue. Merely printing the valve root with stiffer materials and the leaflet with more compliant materials is insufficient because this process over-simplifies the valve biomechanics. In the native valve, for example, the leaflets are composed of three distinct regions: fibrosa, spongiosa, and ventricularis. The fibrosa is concentrated with collagen, which helps provide strength and stiffness to the leaflets; the ventricularis is composed of elastin, which helps the valve return to original shape after stretching; the spongiosa, located between the two layers, is concentrated with glycosaminoglycan, sugar molecules that act as supporting cushions between the fibrosa and ventricularis. As a result, some regions in the leaflet will be stiffer than others, even though the leaflet is overall a compliant tissue.

If, for instance, a region A is stiffer while a region B is more compliant, we would expect the region between A and B to exhibit intermediate stiffness, since a mechanical gradient from A to B exists. Investigating how to recreate these gradients is critical for tissue engineering studies. For instance, the gradient can cue progenitor cells seeded on the tissue to differentiate into various phenotypes based on the mechanical properties of the construct. Additionally, such models can help in the study of diseases, such as valve calcification, that occur notably on the interface regions.

Figure 10:
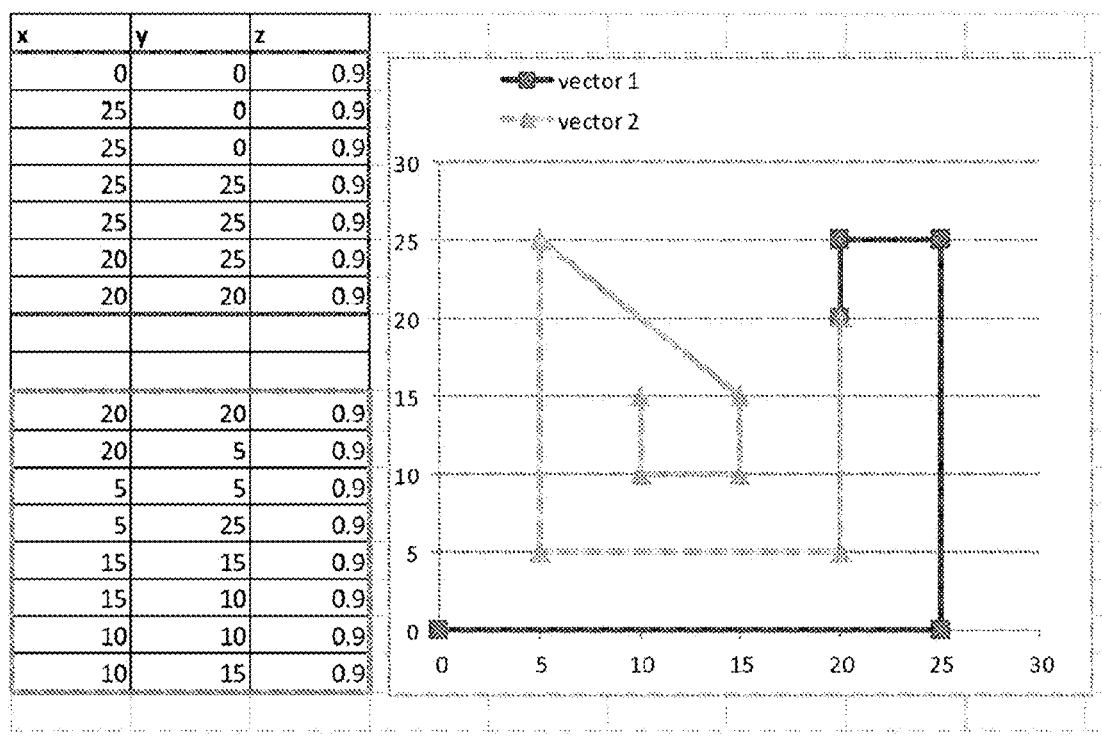
FIG. 10 shows an (x, y, z) coordinate table (left) and an illustration of a two-dimensional vector print layer (right), according to an illustrative embodiment of the invention.
Figure 11B:
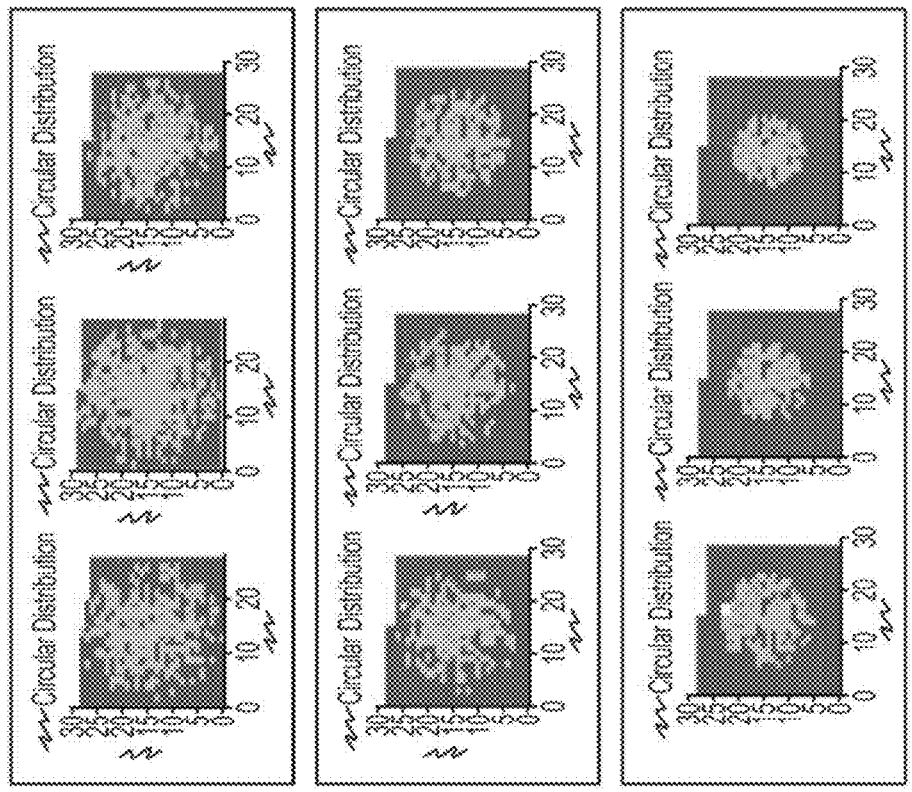
FIG. 11B illustrates the generation of circular gradients, according to an illustrative aspect of the invention.
Figure 11A:
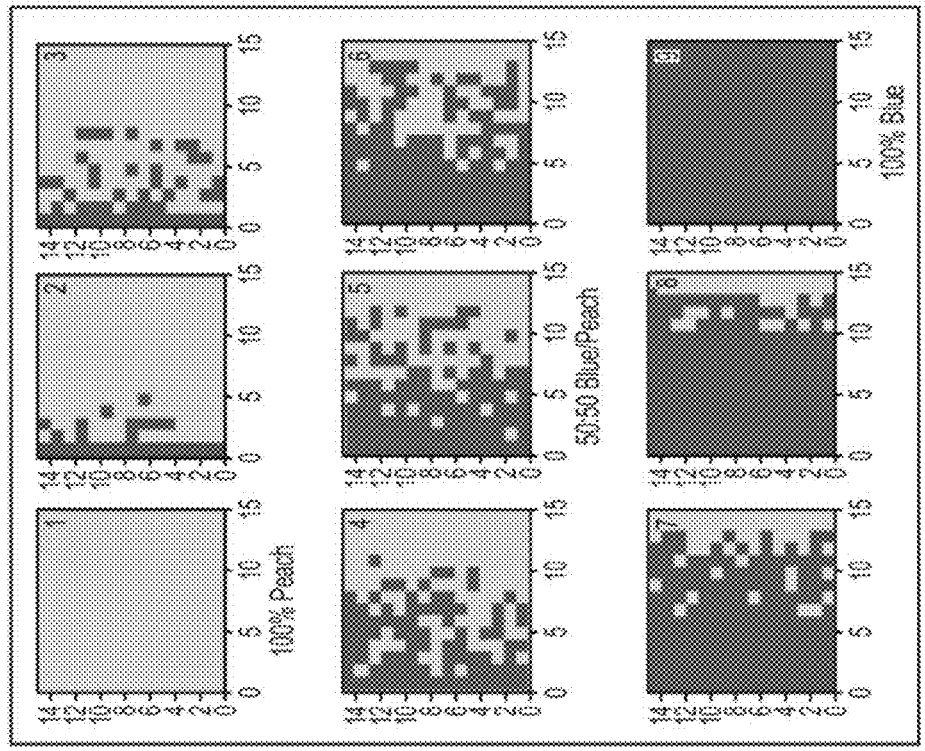
FIG. 11A illustrates the generation of linear gradients, according to an illustrative aspect of the invention.

To accomplish this task, we utilize a process referred to herein as 'vector printing' that enables true locally heterogeneous, functionally-graded fabrication via 3-D printing, as illustrated in FIG. 10. A vector printing module commands the 3-D printer to print from one vertex to another. The 3-D printing system allows the user to input instructions for defining print paths in Cartesian coordinates. For a single layer, material is deposited in an x-y plane. As shown in FIG. 10 (right), two vectors are in a single layer. The printer reads the coordinate points (x,y,z) from a file and extrudes material along that vector/path (square symbols). A new extrusion path can be specified in a different material or the same material (triangle symbols). Fabricating subsequent layers stacked in the z-direction yields a 3-D geometry. The thickness of each layer is typically controlled by printing each layer at a specified interval of height. Unlike STL printing, vector printing prints by lines rather than by drawing and filling the outline of a shape. In the vector format, the start and end vertices are grouped with each other. The printing platform will observe this pair and print accordingly. An advantage of vector printing is that it can more directly specify the path to print than STL printing.

Briefly (a more detailed description is presented below), a dataset consisting of sequential coordinates in a -D Cartesian space is defined. These spatial coordinates describe beginning and end points of path segments for material deposition. An exemplary method to transform this dataset from simple vertices to defined path segments comprises the following steps:

Vertices are defined as an ordered triplet (x, y, z) in Cartesian space. Paths for a fabrication robot are a sequence of spatial coordinates that the deposition tool traverses through in order. The end of a path is denoted by a blank line. To create path segments, we use the initial data set of vertices $V\_n$ and convert into a set of segments defined as $S\_n=[b\_n;\ e\_n;\ \text{'\textbackslash n'}]$ where $b\_n=V\_n-1$ and $e\_n=V\_n$ and '\n' is the standard end of line character. This creates a dataset defining short path segments or travel vectors $S\_n$ that begin at spatial coordinate $b\_n$ and end at coordinate $e\_n$. An additional post-processing technique may then be implemented to remove unwanted artifacts.

Two exemplary approaches for separation of these path segments for deposition of different materials are based on the original vertex data set; i.e., for the specification and ultimate fabrication of a defined target object originating from a) a mathematical model of a perceived (arbitrary) target object or, b) for a defined target object originating from an image file of the object, e.g., Digital Imaging and Communications in Medicine standard (DICOM), MATLAB, PNG, CT, or other image types. For the former origination source (a), a probability distribution function can proscribe a spatial gradient of material compositions. As a simple example (without loss of generality) consider a simple linear gradient. To define a gradual shift from a given Material 1 to a given Material 2 along the x axis, we can define a probability distribution function $$P\_1(x)=1-x/X$$

where x is the mean x value of a path segment and X is the maximum value in the x direction. To create the gradual shift in composition, a random number is generated and compared with the value of P_1(x) for each path segment. If the random number exceeds P_1, the segment is assigned to be fabricated using Material 2, and if the random number is less than P_1, the segment is fabricated by Material 1. The distribution is locally random but overall gradually shifts from 100% Material 1 to 100% Material 2 in a linear fashion. This concept can be extended to any probability density function (with dependence on any or all spatial directions) and is not restricted to binary distribution. For example, the embodied method enables arbitrary gradients to be established by generating images in multiple directions. FIG. 10A illustrates a sequential linear gradient; FIG. 10B illustrates a circular gradient. Stacking the circular gradient would form the lighter (peach) regions into a cone.

Alternatively, for an image-originated object such as, e.g., a DICOM set, the method can use Hounsfield units or gray values to guide the assignment of materials. In the simplest case, we may assign a threshold value; a pixel with intensity greater than the threshold may be fabricated with Material 1, and otherwise it may be fabricated with Material 2. More sophisticated algorithms could, e.g., average the Hounsfield/gray values of surrounding pixels to determine the material deposited at this spatial coordinate.

This concept is important to the specification (and fabrication) of structures that approximate native tissue. Computed tomography and proton density MRI scans (among others) encode gray values/Hounsfield units that are directly proportional to the density of the imaged tissues. This data is seldom used quantitatively, but by applying an appropriate transformation to the data, as embodied herein, it can be used to guide the selection of printing material. Note that virtually any parameter that can discriminate between different entities within an image, e.g., contrast, is useful however it is measured. In MRI and ultrasound, for example, different methods of generating and measuring contrast will be used, but will identify the same fundamental characteristic of the tissue.

An exemplary aspect of this approach is for selection of a photocrosslinkable hydrogel. Multiple hydrogels with distinct curing behaviors could be selected from based on the Hounsfield values. Each gel could be cured to varying degrees due to UV exposure time, and each gel mixture could encompass a different range of stiffness that is described by the Hounsfield values. Hence, a gel might be well characterized to cure to a stiffness corresponding to Hounsfield values in the range [230-420], while another might fit the range [420-700]. A pixel with value 530 could then be produced by depositing a second material, which could be cured for a given length of time to achieve the appropriate mechanical properties.

Printing gradients with the desired line qualities is important for successful fabrication of living tissue. Lines printed too thinly will result in gaps between lines; lines printed too thickly will cause gels to push and overlap with each other, creating bumps and uneven surfaces. To print with the desired line resolution, we first observe how adjusting the deposition rate changes the line thickness of the printed hydrogels. After printing a set of lines, the printed regions are thresholded. The pixels across the printed line are measured to determine line thickness. This model aids in printing with the appropriate parameters so that the layers are free of gaps and bumps.

Another exemplary distribution approach embodied herein is a Graphical User Interface (GUI) that permits easy editing by a user who may need to correct a problematic error or introduce simple changes. This could be implemented as an array of toggle buttons, check boxes, or color coded boxes, for example, each corresponding to a print path. The toggles (labeled by color, numerically, or symbolically, for instance) would allow distribution of a particular path to being printed by one of any number of materials at a click of a mouse. For extensive editing, a click and drag functionality could be implemented.

In addition to quantifying line thickness, the spreading characteristics of aqueous materials can be quantified as well. Spreading of aqueous materials such as hydrogels may occur after printing due to untimely crosslinking. As a result, the line thickness of printed material can change over time, and may cause the overall printed geometry to be different from the intended shape. Predicting the spreading behavior provides the ability to make necessary adjustments to compensate for spreading. A camera can be used to observe and characterize the spreading progress in real time. To capture the spreading successfully, the camera can be in a fixed location over the printed material. In an illustrative aspect, a transparent glass was raised above the print stage and the camera placed directly below the glass; hydrogels were then directly printed on the glass. Since the printed materials can be made visible through the glass panel, the camera can record how the printed line changes over time.

Heterogeneous Anatomical/Geometry Printing

As described herein, aspects of the method embodiment enable the specification and fabrication of object geometries exhibiting locally heterogeneous gradients.

Figure 12:
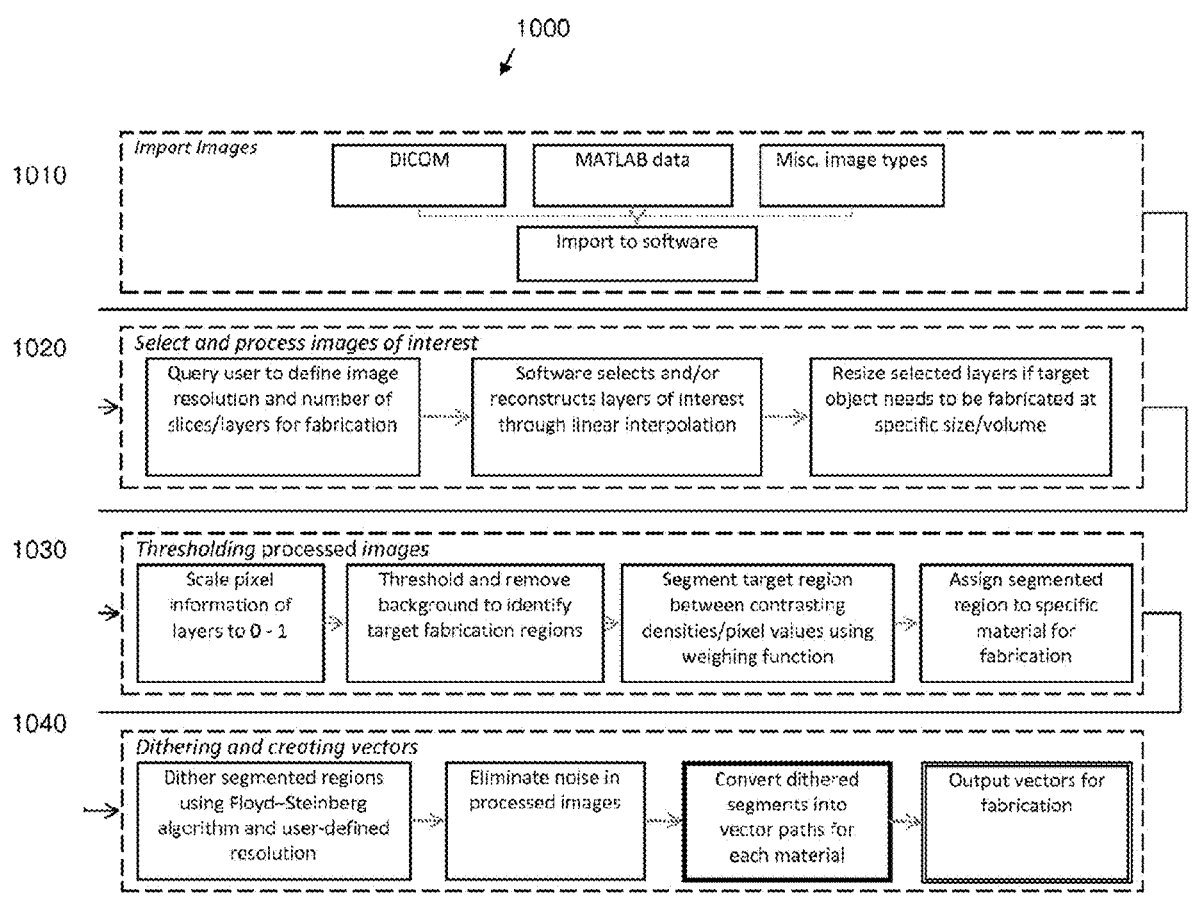
FIG. 12 is a flowchart describing the programmable machine-enabled process steps for specifying (and ultimately fabricating) geometries exhibiting anisotropic heterogeneity based on prescribed images, according to an embodiment of the invention.

Specifying and Fabricating Geometries Exhibiting Anisotropic Heterogeneity Based on Prescribed Images FIG. 12 is a flowchart 1000 describing the programmable machine-enabled process steps for specifying (and optionally, fabricating) geometries exhibiting anisotropic heterogeneity based on prescribed images. The process begins at step 1010 by defining the target object to be fabricated from a prescribed image file such as DICOM, MATLAB, or another known file source. The image is then converted into the appropriate machine-readable format.

At step 1020, images of interest are selected and processed. This includes determining a locally-heterogeneous, anisotropic distribution of phenotypic characteristics of the target object to be fabricated and, more particularly includes the steps of obtaining a plurality of image layers; determining a desired image resolution; selecting one or more of the plurality of image layers as an $n^{th}$ fabrication layer image, where n is equal to or greater than one; and optionally, resizing the $n^{th}$ fabrication layer image for specifying at least one of a size and a volume characteristic of the target object.

At step 1030, the processed images are thresholded. This involves ascribing the distribution of phenotypic characteristics to a plurality of materials from which the target object will be fabricated. This includes the further steps of assigning values between zero to one to each of a plurality of pixels or voxels, or to each of a plurality of sets of adjoining pixels or voxels, of the $n^{th}$ fabrication layer image, and associating a plurality of the assigned values to respective ones of the materials. This may further comprise determining Hounsfield unit values for the pixels or voxels.

Step 1040 involves dithering and creating the print vectors, including stitching together each distribution corresponding to respective ones of the materials into respective sets of vector paths corresponding to respective ones of the materials, wherein each set of vector paths is one or more line elements of a given length and orientation; and creating a vector print file for the target object readable by a compatible fabrication apparatus. A Floyd-Steinberg dithering algorithm can be used, for example. As used herein, the term 'dithering' refers to graphical dithering generally defined as a technique involving the local introduction of noise to acceptably represent a spectrum of color with a limited set of discrete colors while minimizing artifacts such as color banding. In our case, dithering 'bins' the full spectrum of material properties (or image contrast, however defined) into discrete materials for fabrication.

Figure 13:
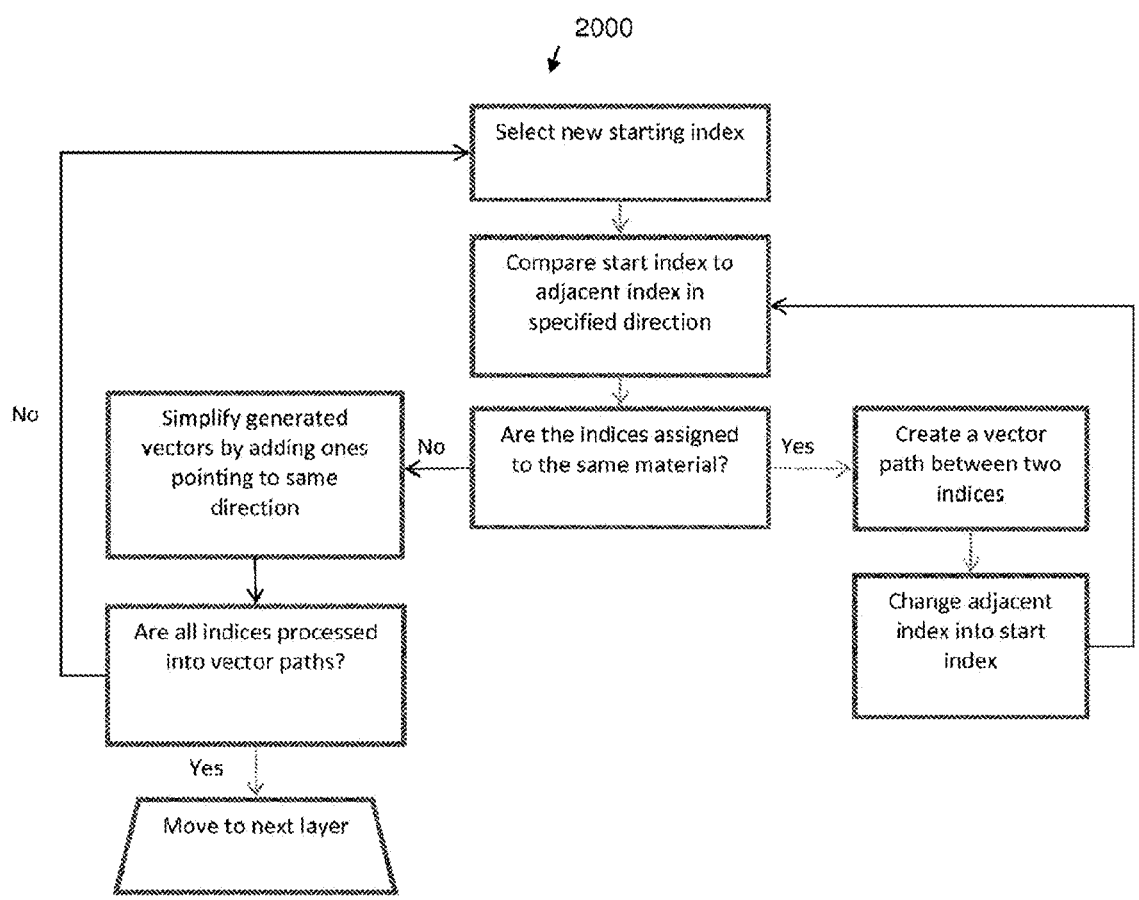
FIG. 13 is a flowchart that further expands the step of converting dithered paths into vector paths, according to an embodiment of the invention.
Figure 14:
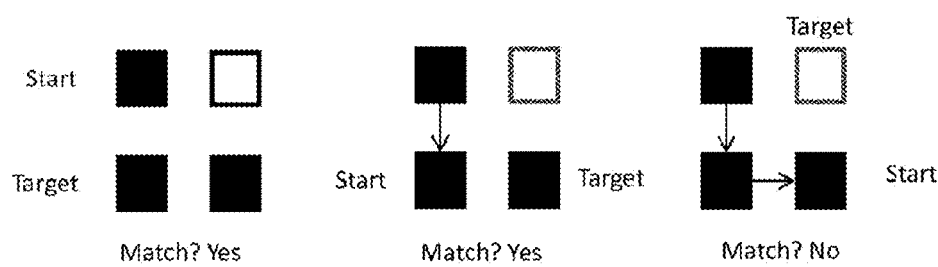
FIG. 14 is a schematic block diagram illustrating the process of creating vector paths between dithered segments, according to an illustrative aspect of the invention.

FIG. 13 is a flowchart 2000 that further expands the step in 1040 of converting dithered paths into vector paths. With reference thereto and as further illustrated in FIG. 14, once images are dithered into segments that would be printed using different materials (e.g., hydrogels), the software creates vector paths for fabricating the target model. A starting segment is first selected and then compared to the neighboring segment. If the segments are assigned to the same material, a vector between the segments is created. This process repeats until sufficient numbers of vector paths have been generated for fabricating the target geometry.

Figure 15:
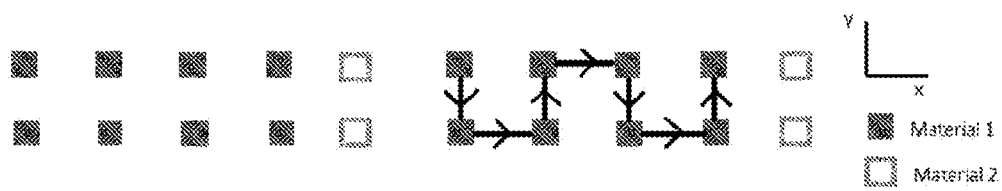
FIG. 15 is a schematic block diagram illustrating a non-ideal scenario of converting dithered segments into vectors due to lack of directionality, according to an illustrative aspect of the invention.

When comparing the starting segment to the adjacent segment, if no directionality is specified the resulting vector paths can exhibit numerous directional changes. This requires more movement of the printer tools, which can lead to inefficient and inaccurate fabrication. As illustrated in FIG. 15, the vectors continuously change directions, which is non-ideal for fabrication.

To enhance fabrication efficiency, the direction at which the program should search for matching coordinates is prioritized, as illustrated in FIG. 16. The program is first instructed to search in the +x direction (FIG. 16a). The software compares the starting segment to the adjacent one directly to the right, and if the segments match, a new vector path is created. This process continues until no more matching index can be found along the +x direction. The program then searches in the second direction (−y direction; FIG. 16b), and vectors paths are created in the −y direction if matching segments are found. If there is no match, the software moves onto the next direction (−x direction; FIG. 16c). Once all direction has been explored, the newly formed vectors along same directions are added to form continuous vector paths (FIG. 16d). A new segment that has not been processed is then selected as a starting point, and the comparison process repeats until all segments have been processed.

Specifying and Fabricating Geometries Exhibiting Anisotropic Heterogeneity Based on Mathematical Models In contrast to the process for specifying and fabricating geometries exhibiting anisotropic heterogeneity based on prescribed images described herein above, in this aspect printable models are directly created (i.e., not from prescribed images). In addition, this process aspect enables control of the gradient establishment. Once the printable geometry is dithered, however, the vector conversion process remains similar to the aforementioned process wherein the target object is obtained from a prescribed image.

FIG. 17 is a flowchart 3000 describing the programmable machine-enabled process steps for specifying (and ultimately fabricating) geometries exhibiting anisotropic heterogeneity based on mathematical models, that are different than the process steps for specifying and fabricating geometries exhibiting anisotropic heterogeneity based on prescribed images described herein above.

The steps include defining the 3-D geometry of a selected target object; determining a gradient distribution of material compositions of the target object to be applied to the geometry; establishing a probability distribution function based on the gradient distribution to determine a plurality of path segments and assigning a plurality of one or more of the path segments to a corresponding plurality of materials from which the target object will be fabricated; dithering the pluralities of path segments based on the probability distribution function; converting the dithered path segments into respective sets of vector paths corresponding to respective ones of the materials, wherein each set of vector paths is one or more line elements of a given length and orientation; and creating a vector print file for the target object readable by a compatible fabrication apparatus.

Figure 18:
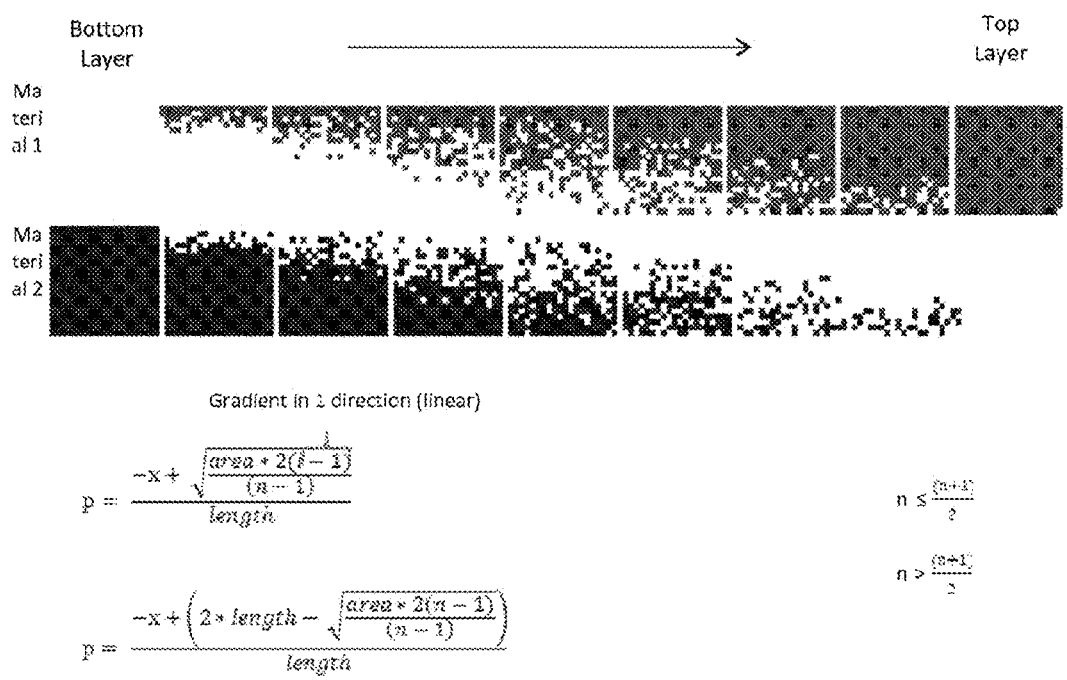
FIG. 18 illustrates a printable layer exhibiting a locally heterogeneous linear gradient based on a linear probability function, according to an illustrative aspect of the invention.

FIG. 18 illustrates a printable layer exhibiting a locally heterogeneous linear gradient based on the one-dimensional probability equations shown in the figure, where p represents the probability of the segment being assigned to material 1, x:—is the x-coordinate on the target segment, i is the layer number (1 is the bottom layer), n is the number of layers.

Figure 19:
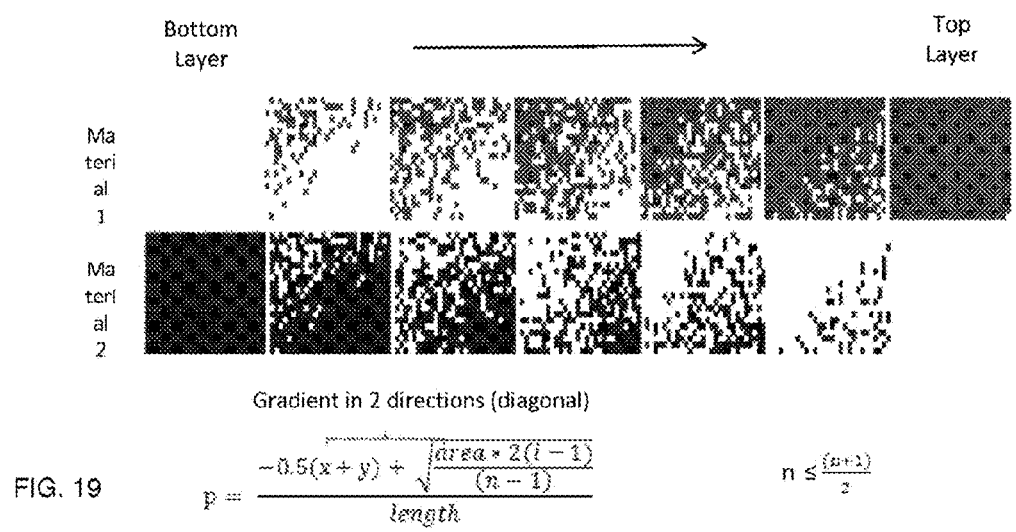
FIG. 19 illustrates a printable layer exhibiting a locally heterogeneous gradient in two directions (diagonal) based on a two dimensional probability function, according to an illustrative aspect of the invention.
Figure 20:
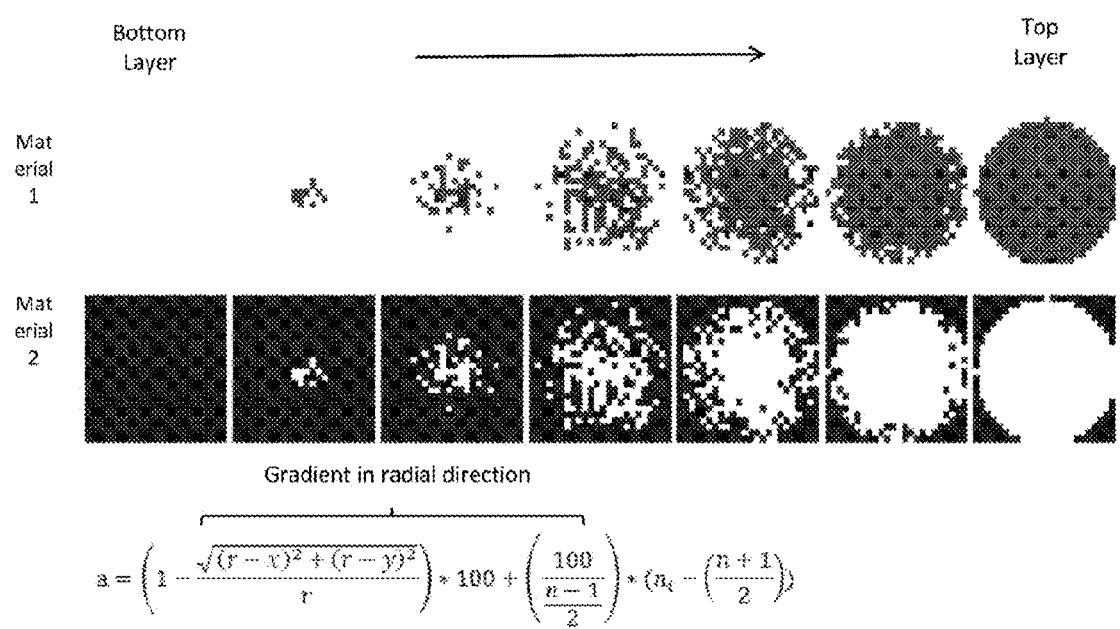
FIG. 20 illustrates a printable layer exhibiting a locally heterogeneous circumferential gradient based on a radial probability function, according to an illustrative aspect of the invention.

FIGS. 19 and 20, respectively, illustrate printable patterns exhibiting locally heterogeneous diagonal, and circumferential gradients based on the illustrated probability equations. (p: probability of segment being assigned to material 1, x: x-coordinate on target segment, y: y-coordinate on target segment, r: radius of target circle, i: layer # (1 is the bottom layer), n: # of layers). Note that gradient distribution need not be prescribed by a single equation, or even equations for the whole 3D material space.

Figure 21:
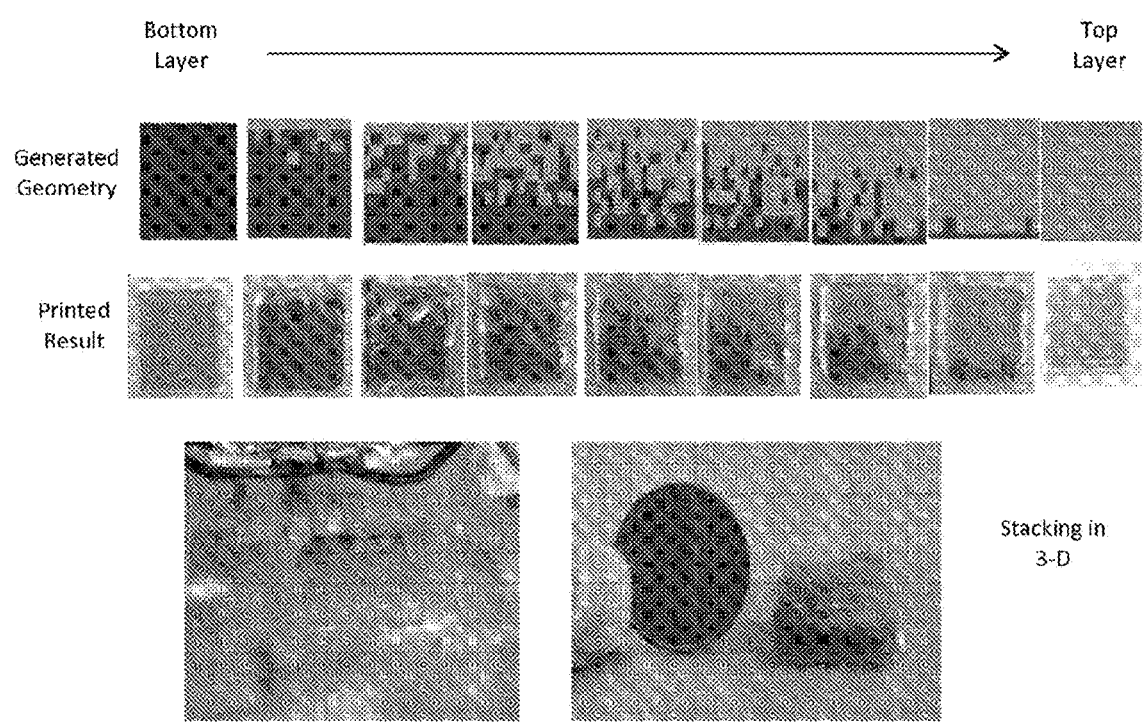
FIG. 21 shows an example of a heterogeneous geometry printed with multiple hydrogel blends.

FIG. 21 shows an example of a locally heterogeneous geometry printed with multiple hydrogel blends.

Based upon the foregoing specification (and fabrication) method aspects, it will be appreciated that implementing a similar vector path algorithm to separately control an onboard photocrosslinking unit simultaneously with printing will provide unique crosslinking behavior not mimicked by simply locating a UV lamp (or other suitable energy source) near the completed deposition, or even locating the lamp proximate to the material while it is being deposited. In each of the latter cases, spatial and temporal control of crosslinking is extremely limited. The embodied implementation will enable controlled photo-curing, allowing the capability of seamless joining of consecutive deposited layers and gradient material distribution between deposited lines. This will provide the ability to control when and where to crosslink, further enabling layer and/or line specific blending with a continuous material gradient between them via diffusion of the initially liquid like elements.

It is to be especially noted that the embodied object specification and fabrication method embodiments do not apply solely to a particular type of medium, method of material deposition, or method of solidification (e.g., curing). Rather, the invention pertains to specifying and generating vector based deposition paths for a selected material(s) to specify and, optionally fabricate an object of interest. Although extruding the material(s) is disclosed as an advantageous aspect of the invention, other techniques may include sintering material(s) in these paths, laying molten metal in these paths, etc. Likewise, two or more materials need not be able to diffuse into each other. This all depends on the user's wishes. While we have demonstrated vector-based traversal of a UV LED array for photocrosslinking various hydrogel materials, the invention is drawn more generally to any applicable chemical or other energy source useful for solidifying or structurally stabilizing a material(s) during object fabrication. The disclosed and claimed process embodiments and aspects are intended to enable any and all of these variations and options.

Glossary of Terms

Computer Aided Design (CAD)—use of computers to draft and/or generate figures in two-dimensional space and solids in 3-dimensional space.

Chemical crosslinking—a chemical catalyses or initiates a reaction that bonds polymer chains together over time. In contrast to photo-crosslinking method, chemical crosslinking is time-dependent.

Example 1: polymer=alginate, crosslinker=$CaCl_2$

Figure 22:
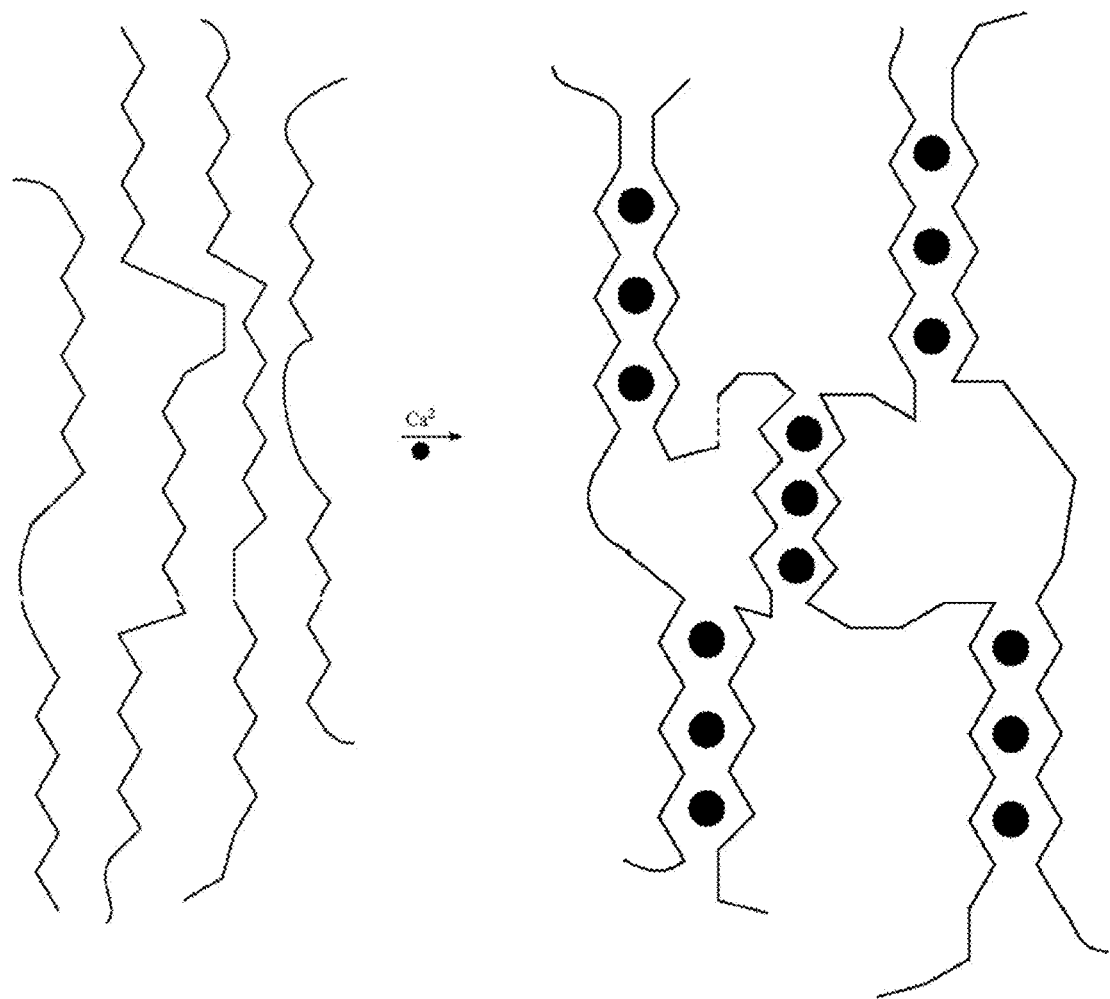
FIG. 22 illustrates an example of chemical crosslinking, in which the polymer is alginate and the crosslinker is $CaCl_2$, according to illustrative aspects of the invention.

FIG. 22 demonstrates binding of $Ca_{2+}$ to L-GulUA-(1-4)-L-GulUA unit in alginate. The main attractive interaction is of an electrostatic nature represented by an attraction between the cation and partially negatively charged oxygen atoms structures when they react with multivalent ions.

Example 2: Silicone sealant—Room temperature vulcanizing silicone sealant is cured by moisture in the air.

Computed Tomography (CT) scan—medical imaging technology using X-rays to image internal structures in 3-dimensional space. The density information from an X-ray CT scan is typically in Hounsfield units. The density data from a CT scan can be communicated in a DICOM file format.

Crosslinking—bonds that link one polymer chain to another. They can be covalent or ionic bonds.

Digital Imaging and Communications in Medicine (DICOM)—standard image format for handling, storing, printing and transmitting information stored in medical images, such as CT and MRI scans. It includes a file format definition and a network communications protocol.

Gel—a term associated with highly swollen polymer networks. A gel typically consists of a cross-linked polymer network holding a large amount of liquid.

Heterogeneous (Merriam-Webster)—adj. consisting of dissimilar or diverse ingredients or constituents.

Hounsfield (HU) scale—scale for describing radiodensity. Calibrated with reference to water. Intensity in an image indicates radiodensity. Bones have ~700 to 3000 HU, while soft tissues such as heart valves can range from −300 to −100 HU. Air is −1000HU, and water is 0 HU.

Hydrogel—consists of water soluble polymers and holds water at equilibrium.

Magnetic Resonance Imaging (MRI)—medical imaging technique used to visualize internal structures using nuclear magnetic resonance (NMR). Can provide improved contrast between different soft tissues, such as muscles and heart.

Mimics®—commercially available software designed to process DICOMs obtained from CT and MRI scans and reconstruct the scan into CAD geometries.

Nuclear Magnetic Resonance (NMR)—phenomenon where nuclei exposed to magnetic field absorb and emit electromagnetic radiation.

Poly(ethylene) diacrylate (PEG-DA)—a photocrosslinkable polymer that can dissolve in water. Dissolving photoinitiators into PEG-DA precursor solution and exposing the solution to UV light can polymerize the precursor solution into a hydrogel. Photo-initiator—a chemical compound that decomposes into free radicals when exposed to light. The free-radicals react with polymer chains that have available double bonds or functional groups to initiate photo-polymerization.

Photo-crosslinking (or photo-polymerization)—use of light source with specific energy to trigger reactions that bonds polymer chains together.

Polymerization—process of joining small molecules by covalent bonds to produce high-molecular weight polymers.

Example: Polymer=PEG-DA, crosslinker=Photoinitiator=Irgacure. PEG-DA has two functional end groups available for crosslinking. With a photo-initiator in the polymer solution, exposing the solution to UV light will create free radicals which will react with the functional ends of the PEGDA chains.

Solid Free-Form Fabrication or 3-D printing—general term for additive manufacturing. The Fab@Home™ printer we have been using falls under the category of Robocasting. Viscous liquid materials are extruded to build three dimensional shapes layer by layer.

Standard Tesselation Language (STL)—file format used in stereolithography CAD software, rapid prototyping software, and CAD manufacturing. STL geometries describes the surface geometry of a three dimensional object without any internal structure information—it is essentially the shell of a 3D shape. The Fab@Home™ 3-D printer software can read a STL geometry, slice it into layers, and plot print paths for fabricating the geometry in 3-D.

Vector—a set of coordinate points to define an extrusion path.

All references, including publications, patent applications, and patents cited herein are hereby incorporated by reference in their entireties to the same extent as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

Therefore, the embodiments are illustrative of the invention rather than limiting of the invention. Revisions and modifications may be made to methods, materials structures and dimensions in accordance with the disclosed embodiments, further in accordance with the accompanying claims.

We claim:

1. A machine-implemented method for specifying a target object to be fabricated, comprising the steps of:
   i) defining the target object to be fabricated, comprising one of sourcing the target object from a prescribed image and sourcing the target object from a mathematical model, wherein the step of sourcing the target object from a prescribed image further comprises reconstructing the image of the target object into a 3D machine-readable format, and further wherein sourcing the target object from a prescribed image comprises the steps of:
      a) obtaining a plurality of image layers;
      b) determining a desired image resolution;
      c) selecting one or more of the plurality of image layers as an $n^{th}$ fabrication layer image, where n is equal to or greater than one; and
      d) optionally, resizing the n'h fabrication layer image for specifying at least one of a size and a volume characteristic of the target object;
   ii) determining a locally-heterogeneous, anisotropic distribution of phenotypic characteristics of the target object to be fabricated, comprising assigning values between zero to one to each of a plurality of pixels or voxels, or to each of a plurality of sets of adjoining pixels or voxels, of the nth fabrication layer image;
   iii) ascribing the distribution of phenotypic characteristics to a plurality of materials from which the target object will be fabricated, comprising associating a plurality of the assigned values to respective ones of the materials;
   iv) stitching together each distribution corresponding to respective ones of the materials into respective sets of vector paths corresponding to respective ones of the materials, wherein each set of vector paths is one or more line elements of a given length and orientation;
   v) creating a vector print file for the target object readable by a compatible fabrication apparatus; and
   vi) directing the fabrication apparatus to execute the vector print file to fabricate the target object.

2. The method of claim 1, wherein the step of associating a plurality of the assigned values to respective ones of the materials further comprises thresholding the assigned values.

3. The method of claim 1, wherein the step of associating a plurality of the assigned values to respective ones of the materials further comprises determining Hounsfield unit values for the pixels or voxels.

4. The method of claim 1, further comprising removing background that is not a part of the target object from the $n^{th}$ fabrication layer image.

5. The method of claim 1, wherein the step of stitching together each distribution further comprises dithering each of the plurality of the assigned values into a plurality of segments corresponding to respective ones of the materials.

6. The method of claim 5, further comprising utilizing a Floyd-Steinberg dithering algorithm.

7. The method of claim 5, further comprising converting each of the plurality of segments into the vector paths for the respective ones of the materials.

8. The method of claim 7, wherein the step of creating a vector path further comprises:
   a) selecting a starting index;
   b) comparing the starting index to an adjacent index in a specified direction;
   c) determining whether the starting and adjacent indices are assigned to the same one of the materials, and
   d) if the starting and adjacent indices are assigned to the same one of the materials, then
   e) creating a vector path between the indices, or
   f) f) if the starting and adjacent indices are not assigned to the same one of the materials, then
   g) changing the adjacent index into a new starting index and performing steps (b-e); and
   h) performing steps (a-g) until a sufficient number of vector paths have been generated to specify the target object.

9. The method of claim 8, further comprising iteratively performing steps (iii-v) for a plurality of the $n^{th}$ fabrication layers, where n is equal to or greater than one.

10. The method of claim 9, further comprising outputting the vector print file for the target object to the compatible fabrication apparatus and fabricating the target object.

11. The method of claim 10, further comprising fabricating the target object in a series of n fabrication layers, and photo-curing a selected region of each $n^{th}$ fabrication layer simultaneously with the layer fabrication or prior to the fabrication of the $n^{th}+1$ layer.

12. The method of claim 1, further comprising iteratively performing steps (iii-v) for a plurality of n fabrication layers, where n is equal to or greater than one.

13. The method of claim 1, wherein the phenotypic characteristics of the target object to be fabricated are surface and/or internal phenotypic characteristics.

14. The method of claim 1, further comprising outputting the vector print file for the target object to the compatible fabrication apparatus and fabricating the target object.

15. The method of claim 14, further comprising fabricating the target object in a series of n fabrication layers, and photo-curing a selected region of each $n^{th}$ fabrication layer simultaneously with the layer fabrication or prior to the fabrication of the $n^{th}+1$ layer.

16. The method of claim 1, wherein the step of sourcing the target object from a mathematical model further comprises:
   defining the 3-D geometry of a selected target object;
   determining a gradient distribution of material compositions of the target object to be applied to the geometry;
   establishing a probability distribution function based on the gradient distribution to determine a plurality of path segments and assigning a plurality of one or more of the path segments to a corresponding plurality of materials from which the target object will be fabricated;

dithering the pluralities of path segments based on the probability distribution function;

converting the dithered path segments into respective sets of vector paths corresponding to respective ones of the materials, wherein each set of vector paths is one or more line elements of a given length and orientation; and creating a vector print file for the target object readable by a compatible fabrication apparatus.

17. The method of claim 16, wherein the gradient distribution is linear.

18. The method of claim 16, wherein the gradient distribution is non-linear.

19. The method of claim 16, wherein the gradient distribution is radial.

20. The method of claim 16, further comprising outputting the vector print file for the target object to the compatible fabrication apparatus and fabricating the target object.

21. The method of claim 20, further comprising fabricating the target object in a series of n fabrication layers, and photo-curing a selected region of each $n^{th}$ fabrication layer simultaneously with the layer fabrication or prior to the fabrication of the $n^{th}+1$ layer.

22. A machine-implemented method for specifying a target object to be fabricated, comprising the steps of:

i) defining the target object to be fabricated, comprising one of sourcing the target object from a prescribed image and sourcing the target object from a mathematical model, wherein the step of sourcing the target object from a prescribed image further comprises reconstructing the image of the target object into a 3D machine-readable format, and further wherein sourcing the target object from a prescribed image comprises the steps of:

a) obtaining a plurality of image layers;
b) determining a desired image resolution;
c) selecting one or more of the plurality of image layers as an $n^{th}$ fabrication layer image, where n is equal to or greater than one; and
d) optionally, resizing the $n^{th}$ fabrication layer image for specifying at least one of a size and a volume characteristic of the target object;

ii) determining a locally-heterogeneous, anisotropic distribution of phenotypic characteristics of the target object to be fabricated, comprising assigning values between zero to one to a each of a plurality of pixels or voxels, or to each of a plurality of sets of adjoining pixels or voxels, of the nth fabrication layer image;

iii) ascribing the distribution of phenotypic characteristics to a plurality of materials from which the target object will be fabricated, comprising associating a plurality of the assigned values to respective ones of the materials;

iv) stitching together each distribution corresponding to respective ones of the materials into respective sets of vector paths corresponding to respective ones of the materials, wherein each set of vector paths is one or more line elements of a given length and orientation, and further where stitching together each distribution further comprises dithering each of the plurality of the assigned values into a plurality of segments corresponding to respective ones of the materials;

v) converting each of the plurality of segments into the vector paths for the respective ones of the materials, comprising:

a) selecting a starting index;
b) comparing the starting index to an adjacent index in a specified direction;
c) determining whether the starting and adjacent indices are assigned to the same one of the materials; and
d) if the starting and adjacent indices are assigned to the same one of the materials, then creating a vector path between the indices; or e) if the starting and adjacent indices are not assigned to the same one of the materials, then changing the adjacent index into a new starting index and performing steps (b-d); and f) performing steps (a-e) until a sufficient number of vector paths have been generated to specify the target object;

vi) creating a vector print file for the target object readable by a compatible fabrication apparatus, and vii) directing the fabrication apparatus to execute the vector print file to fabricate the target object.

* * * * *

UNITED STATES PATENT AND TRADEMARK OFFICE
CERTIFICATE OF CORRECTION

PATENT NO. : 10,894,362 B2
APPLICATION NO. : 16/042461
DATED : January 19, 2021
INVENTOR(S) : Jonathan Butcher et al.

Page 1 of 1

It is certified that error appears in the above-identified patent and that said Letters Patent is hereby corrected as shown below:

In the Claims

Column 19, Line 42, in Claim 1 i) d), please delete the letters "n'h" and replace it with --$n^{th}$--

Column 20, Line 27, in Claim 8, please delete the duplicate "f)"

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*